US008924812B2

(12) United States Patent
Li et al.

(10) Patent No.: US 8,924,812 B2
(45) Date of Patent: Dec. 30, 2014

(54) NON-BINARY LDPC CODE DECODER

(75) Inventors: Shu Li, Sunnyvale, CA (US); Panu Chaichanavong, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 257 days.

(21) Appl. No.: 13/082,120

(22) Filed: Apr. 7, 2011

(65) Prior Publication Data

US 2011/0252286 A1   Oct. 13, 2011

Related U.S. Application Data

(60) Provisional application No. 61/322,240, filed on Apr. 8, 2010.

(51) Int. Cl.
*H03M 13/00* (2006.01)
*H03M 13/11* (2006.01)
*H03M 13/29* (2006.01)

(52) U.S. Cl.
CPC ...... *H03M 13/1171* (2013.01); *H03M 13/1137* (2013.01); *H03M 13/1108* (2013.01); *H03M 13/296* (2013.01); *H03M 13/114* (2013.01); *H03M 13/1125* (2013.01); *H03M 13/1114* (2013.01); *H03M 13/116* (2013.01); *H03M 13/1122* (2013.01)
USPC ........................................................ 714/755

(58) Field of Classification Search
USPC .......................................... 714/755, E11.053
See application file for complete search history.

(56) References Cited

U.S. PATENT DOCUMENTS

| 7,752,523 | B1 | | 7/2010 | Chaichanavong et al. | |
|---|---|---|---|---|---|
| 8,166,379 | B1 | * | 4/2012 | Wu et al. | 714/794 |
| 2006/0171489 | A1 | * | 8/2006 | Ghosh et al. | 375/341 |
| 2009/0287981 | A1 | * | 11/2009 | Kimura et al. | 714/752 |
| 2009/0316803 | A1 | * | 12/2009 | Paker et al. | 375/260 |
| 2009/0327820 | A1 | * | 12/2009 | Asirvatham et al. | 714/699 |
| 2010/0107031 | A1 | * | 4/2010 | Kimura et al. | 714/752 |
| 2011/0075287 | A1 | * | 3/2011 | Risso et al. | 360/31 |

OTHER PUBLICATIONS

CH. Spagnol et al: "Hardware Implementation of LDPC Decoders", IEEE Transactions on Circuits and Systems I: Regular Papers, IEEE, US, vol. 56, No. 12, Dec. 1, 2009, pp. 2609-2620, XP011280793, ISSN: 1549-8328, DOI: DOI:10.1109/TCSI.2009.2016621 abstract; p. 2610-p. 2618; figures 4, 5.

(Continued)

*Primary Examiner* — Daniel McMahon
*Assistant Examiner* — Thien D Nguyen

(57) ABSTRACT

The present disclosure relates generally to data decoding, and more particularly to non-binary iterative decoders. Non-binary LDPC codes and LDPC decoders that may be used to decode non-binary LDPC codes are disclosed. Systems and methods are also disclosed that compute messages related to non-binary LDPC codes, in a LLRV form and in a metric vector form and to process these messages in non-binary LDPC decoders. Systems and methods are additionally disclosed that convert messages between the LLRV form and the metric vector form. The implementation and use of non-binary low density parity check code decoders, the computation of messages in the LLRV and metric vector forms, and the use of message conversion systems and methods, according to this disclosure, may provide increased information relating groups of codeword bits, increased computational efficiency, and improved application performance.

20 Claims, 11 Drawing Sheets

(56) References Cited

OTHER PUBLICATIONS

Savin V. : "Min-Max decoding for non binary LDPC codes", Proc., IEEE International Symposium on Information Theory, ISIT 2008, Jul. 6, 2008, pp. 960-964, XP031303051, ISBN: 978-1-4244-2256-2. p. 961-p. 962.

Risso A: "Layered LDPC Decoding Over for Magnetic Recording Channel", IEEE Transactions on Magnetics, IEEE Service Center, New York, NY, US, vol. 45, No. 10, Oct. 1, 2009, pp. 3683-3686, XP011277283, ISSN: 0018-9464, DOI: DOI:10.1109/TMAG.2009. 2024897 the whole document.

Guilloud F: "Architecture générique de décodeur de codes LDPC", Thése Présentée Pour Obtenir Le Grade De Docteur De L'écolenationale Supérieure Des Télécommunications, XX, XX, Jul. 2, 2004, page Complete, XP002370625, p. 38-p. 39, p. 60-p. 64.

International Search Authority of PCT : "International Search Report" and "Written Opinion of the International Searching Authority", European Patent Office, P. B. 5818 Patentlaan 2, NL-2280 HV Rijswijk, date of mailing: Jul. 4, 2011. International application No. PCT/US2011/031583, international filing date: Apr. 7, 2011. the two whole documents.

\* cited by examiner

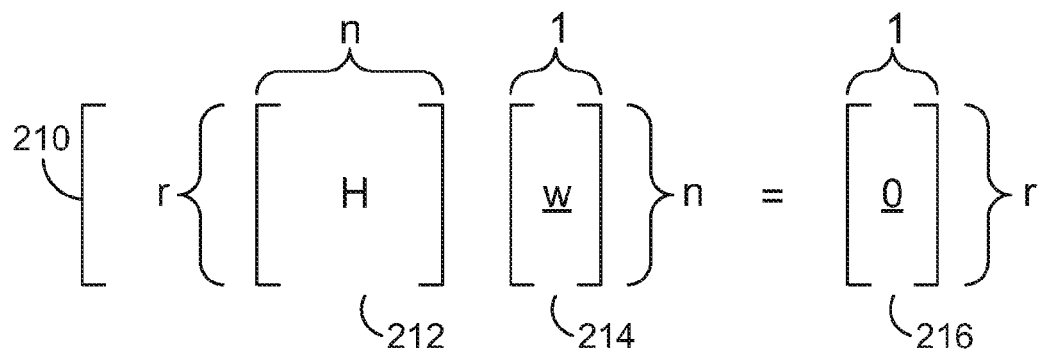

FIG. 2A $$L_v = \begin{bmatrix} \log\left(\dfrac{P(v=0)}{P(v=1)}\right) \\ \log\left(\dfrac{P(v=0)}{P(v=2)}\right) \\ \vdots \\ \log\left(\dfrac{P(v=0)}{P(v=q-1)}\right) \end{bmatrix} \Big\} q-1 \quad 220$$

$$S_v = \underset{x \in GF(q)}{\arg\text{Max}}\ P(v=x) \quad 232$$

$$M_v = \begin{bmatrix} \log\left(\dfrac{P(v=s_v)}{P(v=s_v+1)}\right) \\ \log\left(\dfrac{P(v=s_v)}{P(v=s_v+2)}\right) \\ \vdots \\ \log\left(\dfrac{P(v=s_v)}{P(v=s_v+(q-1))}\right) \end{bmatrix} \Big\} q-1 \quad 230$$

FIG. 2B

242 $\left[ s_V = \arg \min \{ 0, L_V(1), ..., L_V(q-1) \} \right.$

240 $\left[ \begin{array}{l} M_V(x) = L_V(s + x) - L_V(s_V) \\ \text{where } L_V(0) = 0 \end{array} \right.$ 250 $\left[ \begin{array}{l} L_V(x) = M_V(s_V + x) - M_V(s_V) \\ \text{where } M_V(0) = 0 \end{array} \right.$

FIG. 2C

NON-BINARY LDPC CODE DECODER

CROSS-REFERENCE TO RELATED APPLICATIONS

This claims the benefit under 35 U.S.C. §119(e) of U.S. Provisional Application No. 61/322,240, filed Apr. 8, 2010, the contents of which is hereby incorporated by reference herein in its entirety.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

The present disclosure relates generally to data decoding, and more particularly to non-binary iterative decoders for data encoded with a low-density parity check (LDPC) encoder.

LDPC codes may be used for effectively correcting errors in information transmitted in a noisy communications or data storage channel. The information may be encoded (by a LDPC encoder) prior to transmission and then subsequently decoded (by a LDPC decoder) when received. The performance capability of a coding scheme, such as a LDPC coding scheme, is often described by the code's performance curve. The performance curve is a plot of signal-to-noise ratios (SNR) vs. Bit Error Rate (BER), or equivalently Sector Error Rate (SER). LDPC codes are one of the best performing error correcting codes, along with Turbo codes, for use in correcting errors in information transmitted on almost all communication and data storage channels in use.

Traditional LDPC codes may include binary symbols and may be represented by one of many different types of parity check matrices. Traditional LDPC codes may be represented by parity check matrices that include binary symbols. The structure of an LDPC code's parity check matrix may be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

As used herein, the term message refers to a numerical value, known as soft-information. In the case of traditional binary LDPC codes, messages may be represented in a log likelihood ratio (LLR) form. A LDPC decoder (e.g., a flooding decoder) may decode LDPC codes using an iterative message passing algorithm (flooding decoding), such as a min-sum decoding algorithm. Such algorithms may decode a received codeword using an iterative process in which each iteration includes two message computation update steps involving check nodes and variable nodes passing messages to one another. A LDPC decoder (e.g., a layered decoder) may use a layered approach to decoding (layered decoding) to decode LDPC codes. This approach involves messages being iteratively computed, updated, and stored.

LDPC codes and decoders that are used to decode LDPC codes may be used in numerous applications and devices. For example, data storage, satellite communications, wireless communications, wire-line communications, and power-line communications are applications that may each require the use of LDPC codes and LDPC decoders. Devices such as digital camera flash memory storage, satellites, mobile phones, and other mobile devices may also each require the use of LDPC codes and LDPC decoders.

Traditional LDPC codes, that include transmitted binary bits, may not be able to take advantage of information relating groups of several of these bits. For example, the dependency of bit errors that may occur, as a result of transmission of traditional LDPC code bits through a noisy communications or data storage channel may not be easy to determine from log likelihood ratios traditionally computed for each transmitted bit in the code decoding process. As a result, traditional LDPC codes, that include binary bits, and traditional LDPC decoders may not perform as what may be needed for particular applications of LDPC codes and may not be as computationally efficient as what may be needed for particular applications of LDPC codes.

SUMMARY OF THE DISCLOSURE

Accordingly, non-binary LDPC codes and LDPC decoders that may be used to decode non-binary LDPC codes are disclosed. Systems and methods are also disclosed to compute messages (equivalently, soft information), related to non-binary LDPC codes, in a log-likelihood-ratio vector (LLRV) form and in a metric vector form and to process these messages in non-binary LDPC decoders. Systems and methods are additionally disclosed to convert messages between the LLRV form and the metric vector form. The implementation and use of non-binary low density parity check code decoders, the computation of messages in the LLRV and metric vector forms, and the use of message conversion systems and methods, according to this disclosure, may provide increased information relating groups of several of the codeword bits, increased computational efficiency and decoding ability, and improved application performance.

In particular, non-binary LDPC codes to be decoded may be include non-binary symbols or variables. Each non-binary symbol or variable may be used to represent a group of several bits (for transmission on a communications channel and subsequent reception by a non-binary LDPC decoder). The use of non-binary symbols or variables in LDPC codes for use in the systems and methods described herein may allow for greater interdependency information pertaining to the bits in the group associated with the symbols or variables (when compared with the use of binary codes). The use of systems and methods, including non-binary LDPC codes and non-binary LDPC decoders, according to this disclosure, may provide a gain in performance over traditional binary LPDC code when used in conjunction with a channel that has inter-symbol interference (ISI). The use of systems and methods according to this disclosure, may also provide a substantial gain over traditional binary LPDC code when used in conjunction with a channel that has no ISI. For example, the use of systems and methods according to this disclosure may provide a performance gain of about or greater than 0.6 decibels (dB) and may allow for more effective corrective power in the decoding process.

In addition, a non-binary LDPC code's parity check matrix with a column weight (cw) that is the same as that of a binary LDPC code's parity check matrix, may have a lower error floor with regards to the LDPC code's performance curve. If cw is reduced for a non-binary LDPC code's parity check matrix, a substantial gain may be realized in the code's performance curve while a lower error floor may be maintained. A lower cw may allow for larger non-binary LDPC decoder pipelines (which determine the amount of data that may be processed by a decoder at one time) and allows for more iterations for processing a non-binary LDPC code. Moreover, a lower cw may allow for more effective correction of detected defects and other errors.

In some embodiments, soft information may be determined based on a received vector using, e.g., a detector. A plurality of messages may be computed based on the determined soft information using, e.g., a decoder. Each of the plurality of messages may be in a first form or a second form. At least one of the plurality of messages may be converted from the form that it is in to the other of the first or second forms using, e.g., a format converter.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which:

FIG. 2A shows an illustrative example of the properties of a codeword in accordance with some embodiments;

FIG. 2B shows an illustrative example of a message in LLRV form and in metric vector form for GF(q) codewords in accordance with some embodiments;

FIG. 2C shows illustrative equations used for converting a message between the LLRV form and the metric vector form for GF(q) codewords in accordance with some embodiments;

DETAILED DESCRIPTION OF THE DISCLOSURE

As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively. Systems and methods related to non-binary LDPC codes and non-binary LDPC decoders are provided for increased information relating groups of codeword bits, increased computational efficiency, and improved application performance. In applications or devices where information may be altered by interference signals or other phenomena, error-correction codes, such as non-binary LDPC codes, may provide a measured way to protect information against such interference.

The following description of embodiments of the present disclosure provides illustration and description, but is not intended to be exhaustive or to limit the disclosure to the precise form disclosed. Modifications and variations are possible in light of the above teachings or may be acquired from practice of what is disclosed herein. For example, while a LDPC decoder is described with relation to FIGS. 1-10, below, this element may be replaced by any type of decoder (e.g., a Turbo Code decoder, a layered decoder, or a flooding decoder). The decoder may make use of either hard information (e.g., using a hard decoder such as a bit-flipping decoder) or soft information (e.g., using an iterative soft decoder) to decode incoming information. While multiple examples, that make use of exemplary Galois Fields of size 4, are disclosed herein, Galois Fields of any size may be used. While certain components of the present disclosure have been described as implemented in hardware and others in software, other configurations may be possible.

Figure 1:
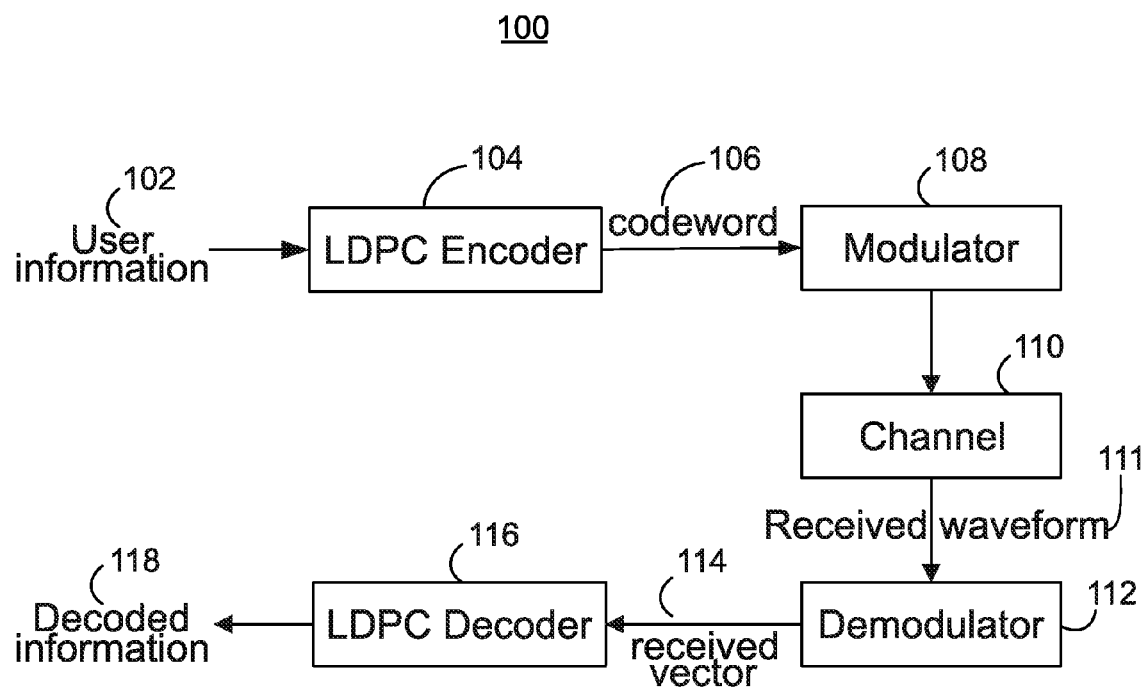
FIG. 1 shows an illustrative communication or data storage system that utilizes error-correction codes for achieving reliable communication or storage in accordance with some embodiments.

FIG. 1 shows an illustrative communication or data storage system 100 that utilizes error-correction codes for achieving reliable communication or storage in accordance with some embodiments. User information 102 is encoded through encoder 104. User information 102, often referred to as the message information or a message vector, may be grouped into units of k symbols, where each symbol may be binary, ternary, quaternary, or any other suitable type of data. In the process of encoding user information 102, different codes may be used by encoder 104 to achieve different results.

As shown in FIG. 1, encoder 104 may encode user information 102 using a non-binary low density parity check (LDPC) code. Non-binary LDPC codes may include non-binary symbols. Non-binary LDPC codes may be represented by one of many different types of parity check matrices, as described above, that contain non-binary symbol elements. The result of encoding user information 102 is codeword 106, also denoted as w. Codeword 106 may be of a predetermined length, which may be referred to as n, where n≥k. Codeword 106 may include non-binary symbols corresponding to any of the elements in Galois Field (q), GF(q), where q denotes the number of elements in the Galois Field. Codeword 106 may be referred to as a GF(q) codeword.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption. Each entry in received vector 114 may be referred to as a symbol or a variable. Each variable or symbol may be one of multiple non-binary values.

Received vector 114 may then be processed (decoded) by LDPC decoder 116. This processing may also, equivalently, be referred to as decoding a non-binary LDPC code or a received vector. LDPC decoder 116 may be a non-binary code decoder. LDPC decoder 116 may be used to correct or detect errors in received vector 114. LDPC decoder 116 may use a barrel shifter. A barrel shifter may be used by LDPC decoder 116 to shift messages computed or received by the LDPC decoder in order to decode a LDPC code. LDPC decoder 116 may use an iterative message-passing algorithm or layered decoding to correct or detect errors in received vector 114. LDPC decoder 116 may receive (e.g., from a channel detector, such as a SOVA detector) or compute an initial set of messages (soft information) in a log-likelihood-ratio message vector (LLRV) form or in a metric vector form based on the entries of received vector 114. For example, for GF(4) codewords, LDPC decoder 116 may compute or receive an initial message in LLRV form based on the equation $$L_{initial}(vi) = \left[\log\left(\frac{P(v_i = 0)}{P(v_i = 1)}\right), \log\left(\frac{P(v_i = 0)}{P(v_i = 2)}\right), \log\left(\frac{P(v_i = 0)}{P(v_i = 3)}\right)\right]^T$$

for each i, where $v_i$ may represent the variable associated with the $i^{th}$ entry in received vector 114. LDPC decoder 116 may instead receive the initial messages in metric vector form. As will be discussed in greater detail, below, LDPC decoder 116 may use the initial messages in LLRV and/or metric vector form while processing messages in the message passing algorithm or in layered decoding. When utilizing such iterative algorithms, LDPC decoder 116 may perform several iterations of the algorithm until the output of LDPC decoder 116 converges to a valid codeword. In some instances, the output of LDPC decoder 116 may fail to converge to a valid codeword. Decoder failure may be caused by a variety of reasons. Because the output of LDPC decoder 116 may never converge to a valid codeword in certain situations, LDPC decoder 116 may be equipped with a maximum iteration limit, which may be any suitable predetermined number. When LDPC decoder 116 reaches the maximum iteration limit, LDPC decoder 116 may automatically terminate operation and move on to the next received vector 114. However, if the output of LDPC decoder 116 successfully converges to a valid iterative codeword, LDPC decoder 116 may then output decoded information 118.

FIG. 2A shows an illustrative example of the properties of codeword 106 of FIG. 1 in accordance with some embodiments. The LDPC codes processed by encoder 104 of FIG. 1 and LDPC decoder 116 of FIG. 1 are conventionally represented by mathematical vector models. In particular, a non-binary LDPC code may be described by its parity check matrix H. Equation 210 illustrates parity check matrix 212.

Parity check matrix 212 may include non-binary elements. Parity check matrix 212 may be of size [r×n], corresponding to codewords of length n and syndromes of length r. Codewords may be, for example, n-length codeword 106 of FIG. 1 or n-length received vector 114 of FIG. 1. Syndrome length r may satisfy the inequality r≥n−k and where k is the length of the information being encoded (e.g., length of user information 102 of FIG. 1). When parity check matrix 212 is multiplied by codeword 214, the result is zero-vector 216, which is a vector of size [r×1] where all elements equal zero. Parity check matrix 212 has a maximum column weight ($cw_{max}$) defined to be the maximum of the set of the number of non-zero entries in each column of parity check matrix 212. Parity check matrix 212 is not unique, and may be chosen, for example, to be computationally convenient and/or to decrease the number of errors generated by the message passing algorithm in LDPC decoder 116. As discussed in relation to FIG. 1, codeword 214 (or a received vector) may be decoded in LDPC decoder 116 to produce decoded information 118.

By way of example, A non-binary parity check matrix defined for GF(4), where entries can take 4 different values, may be $$H = \begin{bmatrix} 1 & 2 & 0 & 3 & 0 \\ 0 & 2 & 1 & 0 & 2 \end{bmatrix}$$

and a GF(4) codeword may be w=[2 1 3 0 3]$^T$. For GF(4) codewords (and received vectors) addition and multiplication may be performed according to the following tables:

| addition | 0 | 1 | 2 | 3 | multiplication | 0 | 1 | 2 | 3 |
|---|---|---|---|---|---|---|---|---|---|
| 0 | 0 | 1 | 2 | 3 | 0 | 0 | 0 | 0 | 0 |
| 1 | 1 | 0 | 3 | 2 | 1 | 0 | 1 | 2 | 3 |
| 2 | 2 | 3 | 0 | 1 | 2 | 0 | 2 | 3 | 1 |
| 3 | 3 | 2 | 1 | 0 | 3 | 0 | 3 | 1 | 2 | where the result of an addition of an entry in the first row with an entry in the first column is shown in the first table and the result of a multiplication of an entry in the first row with an entry in the first column is shown in the second table. The result, therefore, of multiplying the parity check matrix H with the codeword w is a zero vector, because 1×2+2×1+0×3+3×0+0×3=0 and 0×2+2×1+1×3+0×0+2×3=0.

In general, operations such as addition and multiplication associated with GF(q) codewords may be defined according to finite field arithmetic associated with GF(q). Such operations associated with GF(q) codewords may be referred to as GF(q) operations.

FIG. 2B shows an illustrative example of a message in LLRV form and in metric vector form for GF(q) codewords in accordance with some embodiments. Equation 220 illustrates a message, $L_v$, in LLRV form. $L_v$ may be of size q−1. For a codeword (e.g., codeword 214 of FIG. 2) or a received vector (e.g., received vector 114 of FIG. 1), $L_v$ may indicate the likelihood of a particular variable, v, in the codeword or received vector equaling a particular element in GF(q) relative to v equaling zero. For a codeword or a received vector, the likelihood of a variable, v, in the codeword or received vector, equaling zero relative to itself, is equal to 0 (since log(P(v=0)/P(v=0))=0). The most likely value for the variable may correspond to the variable, v, associated with the minimum entry in $L_v$, or zero, if zero is the less than the minimum entry. For example, for GF(4), 2 is the most likely value for the variable associated with the message $L_v=[-1\ -4\ 5]^T$ and 0 is the most likely value for the variable associated with the message $L_v=[8\ 9\ 2]^T$.

Equations 230 illustrates a message, $M_v$, in metric vector form, and equation 232 illustrates the most likely variable value, $s_v$. The value of $s_v$ may indicate the most likely variable value of all the elements in GF(q). $M_v$ may be of size q−1 and nonnegative (i.e., all of the entries of $M_v$ are nonnegative). For a codeword or a received vector, $M_v(x)$ may represent the likelihood of a variable, v, in the codeword or a received vector equaling $s_v+x$, relative to v equaling $s_v$, where x is an element in GF(q) and the addition is a GF(q) operation. For example the most likely value may be $s_v=1$ for the variable, v, associated with the message $M_v=[6\ 2\ 9]^T$. In that case, as indicated by $M_v$, the likelihood of the variable v equaling $s_v+1=0$ is 6 away from the likelihood of it equaling $s_v=1$ (using GF(4) operations). The likelihood of the variable v equaling $s_v+2=3$ is 2 away from the likelihood of it equaling $s_v=1$. The likelihood of the variable v equaling $s_v+3=2$ is 9 away from the likelihood of it equaling $s_v=1$.

The LLRV form, may be generally expressed as $L_v(x)=\log(P(v=0))-\log(P(v=x))$ (after expansion of the logarithm). The $\log(P(v=0))$ term of $L_v$ may instead be defined to be any constant value, c. For example, in the calculation of a new LLRV form, the value of c may be set equal to $\log(P(v=s_v))$, where $s_v$ is defined as it is above. In this example, the message $L_v=-[6\ 3\ -4]^T$ in the original LLRV form, may be equivalently represented as $s_v=1$ and $M_v=[6\ 2\ 9]^T$ in the metric vector form, and $L_v=[6\ 0\ 9\ 2]^T$ in the new LLRV form. The new LLRV form may be a constant offset from the original LLRV form. The new LLRV form may require four elements (i.e., four numbers) and may therefore not be stored in memory. The new LLRV form may be computed as an intermediate step for use in processing. As another example, a value c equal to $\log(P(v=0))$, when $x=0$ may be used to save memory, because $L_v(0)=0$, and this value may not need to be stored in memory. If the value of c is set equal to $\log(P(v=s_v))$, then $L_v(x)=\log(P(v=s_v))-\log(P(v=x))$, which is similar to the metric vector form $M_v=\log(P(v=s_v))-\log(P(v=s_v+x))$. Therefore, when c is set equal to $\log(P(v=s_v))$, conversion between $L_v$ and $M_v$ may be made simpler. For example, in this case, $M_v(x)=L_v(s_v+x)$ and $L_v(x)=M_v(s_v+x)$, both of which may not require addition and/or subtraction for the conversion. Using the new LLRV, form may result in a large savings in the number of additions and comparisons to convert to metric vector form. For example, such savings can be realized when two messages in metric vector form are to be converted to the LLRV form and added, and the result is to be converted back to the metric vector form. In particular, the conversion to and addition in the LLRV form may take 2*(q−1) additions and (q−1) additions, respectively, and the conversion of the result to metric vector form may take (q−1) additions and (q−1) comparisons. Thus, the total number of additions and comparisons required may be 4*(q−1) additions and q−1 comparisons. However, using the new LLRV form for these set of operations requires only (q−1) additions and (q−1) comparisons.

FIG. 2C shows illustrative equations used for converting a message between the LLRV form and the metric vector form for GF(q) codewords in accordance with some embodiments. It may be possible to convert between a message (also known as soft information) in a LLRV form and the message in a metric vector form. Given a message in a LLRV form, the metric vector form may be computed using equation 242 to determine the value of $s_v$ and equation 240 to determine the vector $M_v$. For example, for GF(4) codewords or received vectors, and for the message $L_v=[-6\ 3\ -4]^T$, the metric vector form is $s_v=\arg\min\{0, L_v(1), L_v(2), L_v(3)\}=\arg\min\{0, -6, 3, -4\}=1$ and $M_v(x)=\log(P(v=s_v)/P(v=s_v+x))=\log(P(v=0)/P(v=s_v+x))-\log(P(v=0)/P(v=s_v))=L_v(s_v+x)-L_v(s_v)=[6\ 2\ 9]^T$, where $M_v(0)=0$, and where GF(4) operations are used for addition and multiplication of variable values. In particular, in metric vector form, the most likely value, $s_v=1$ corresponds to the variable value associated with the minimum of the entries in $L_v$, $\{0, -6, 3, -4\}$. Then, since $s_v+1=0$, and since, in $L_v$, the difference in the likelihood of 0 and 1 is 6, the first entry in $M_v$ is 6. Similarly, since $s_v+2=3$, and since, in $L_v$, the difference in the likelihood of 3 and 1 is 2, the second entry in $M_v$ is 2. Additionally, since $s_v+3=2$, and since, in $L_v$, the difference in the likelihood of 2 and 1 is 9, the third entry in $M_v$ is 9.

Given a message in a metric vector form, the LLRV form may be computed using equation 250 to determine the vector $L_v$. For example, for GF(4) codewords or received vectors, and for the message $M_v=[6\ 2\ 9]^T$, where $s_v=1$, the LLRV form is $L_v(x)=\log(P(v=0)/P(v=x))=\log(P(v=s_v)/P(v=x))-\log(P(v=s_v)/P(v=0))=M_v(s_v+x)-M_v(s_v)=[-6\ 3\ -4]^T$, where $L_v(0)=0$, and where GF(4) operations are used for addition and multiplication of variable values. In particular, the most likely value is $s_v-1$. Then, in LLRV form, $Lv(0)=0$, and to keep the same relative likelihood between 0 and 1 (i.e., a relative likelihood of 6), $Lv(1)=-6$. To keep the same relative likelihood between 3 and 1 (i.e., a relative likelihood of 2), $Lv(3)=-4$. To keep the same relative likelihood between 2 and 1 (i.e., a relative likelihood of 9), $Lv(2)=3$.

Figure 3:
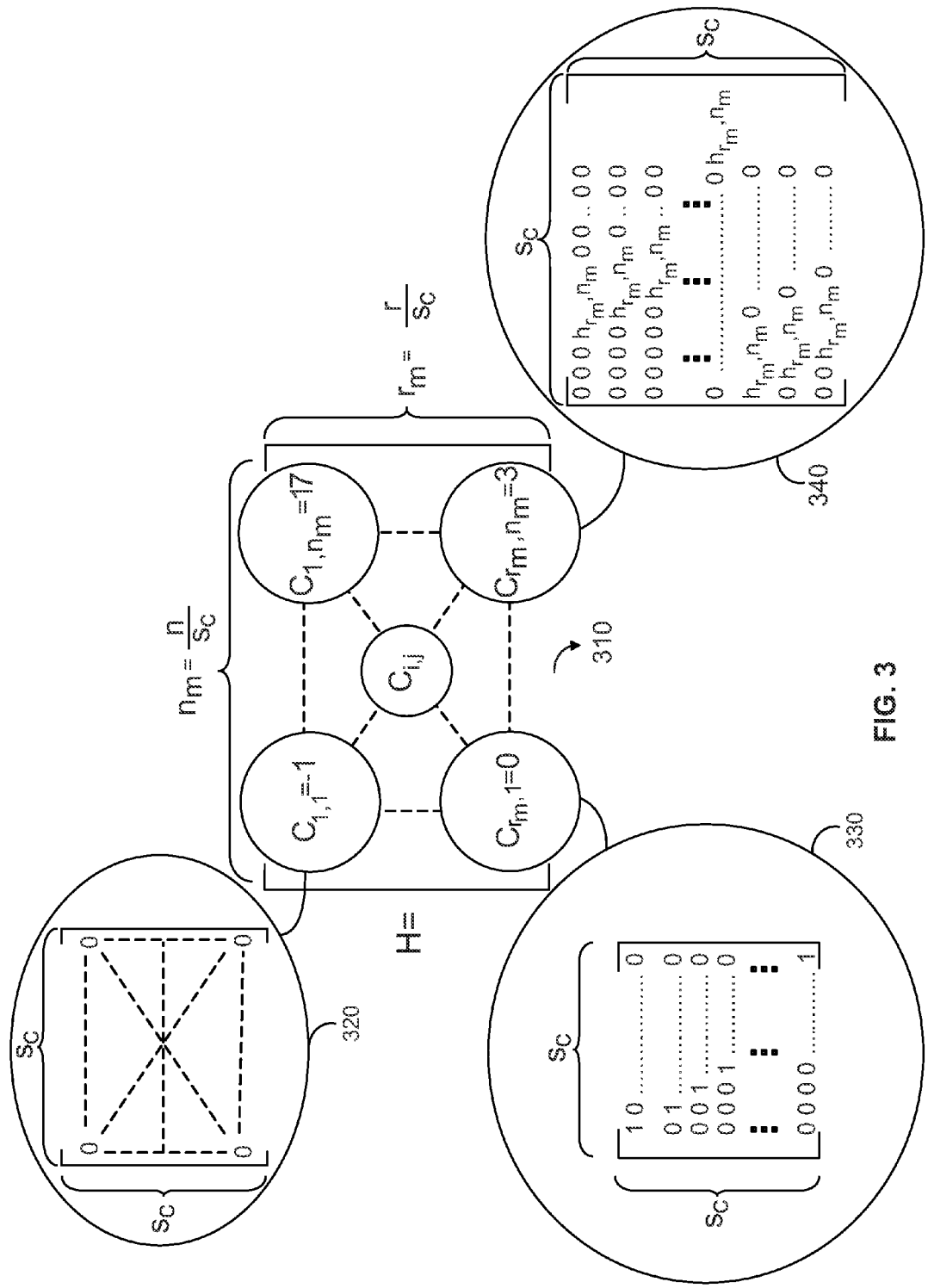
FIG. 3 shows an illustrative example of quasi-cyclic non-binary parity check matrix in a mother matrix representation in accordance with some embodiments.

FIG. 3 shows an illustrative example of non-binary quasi-cyclic parity check matrix 310 in a mother matrix representation in accordance with some embodiments. A mother matrix representation is a compact way for describing a matrix that may contain a large number of elements. The mother matrix representation is equivalent to the normal matrix representation, but may be advantageous in illustrating the structure of a possibly large matrix without the necessity of explicitly listing each element in the matrix.

A non-binary quasi-cyclic LDPC (QC-LDPC) code representation is defined by the characteristic that the non-binary parity check matrix for that particular code is quasi-cyclic. A quasi-cyclic parity check matrix in a mother matrix representation may be made up of circular submatrices known as circulants. Circulant 340 is one such matrix. Circulant 340 is a square matrix—i.e. circulant 340 has the same number of rows as columns. This number is commonly referred to as the circulant size $S_c$. In addition, circulants have the property that for any given positive integer $C_{i,j}<S_c$, any row/column of the circulant matrix may be cyclically shifted by $C_{i,j}$ positions to obtain another row/column. The value of each non-negative integer in non-binary quasi-cyclic parity check matrix 310 specifies the corresponding circulant submatrix in terms of a "shift," $C_{i,j}$, relative to a non-binary identity matrix (e.g., defined by elements which are "0" and elements which are one or more binary or non-binary values, $h_{x,y}$). For example, the number zero represents one type of identity matrix, identity matrix 330 of size $S_c$. The number three represents matrix 340 which is non-binary identity matrix 330 with each row cyclically shifted to the right by three positions. As a matter of notation, minus-one denotes the all-zero matrix 320. For brevity, the phrase "non-zero circulant" will be used to refer to any circulant matrix that is not the all-zero matrix. Recall that parity check matrix 310 is of size [r×n]. Thus, the size of the mother matrix is $[r_m=r/S_c \times n_m=n/S_c]$, where $S_c$, r, and n are chosen so that $r_m$ and $n_m$ are integers.

If a quasi-cyclic representation of a non-binary parity check matrix is used, then the implementation of an LDPC encoder and decoder (e.g., LDPC encoder 104 and LDPC decoder 116), may be significantly simplified. One reason for this is that non-binary parity check matrix 310 may be much easier to store, since only the first row/column of each circulant matrix needs to be stored in order to generate the entire circulant. If the circulant is sparse (has low row/column weight) then it may be stored by simply storing the positions and the values in its first row (or first column). Furthermore by using a quasi-cyclic representation of a non-binary parity check matrix, the storage of the messages used during the decoding of a LDPC vector within LDPC decoders may also be made more compact and parallelization in the encoder/decoder may be achievable with simple shifting operations, since adjacent rows (or adjacent columns) corresponding to the same circulant are cyclic shifts of each other. In addition, for some non-binary quasi-cyclic LDPC codes, encoding and decoding can be further simplified by efficient address-generation.

Figure 4:
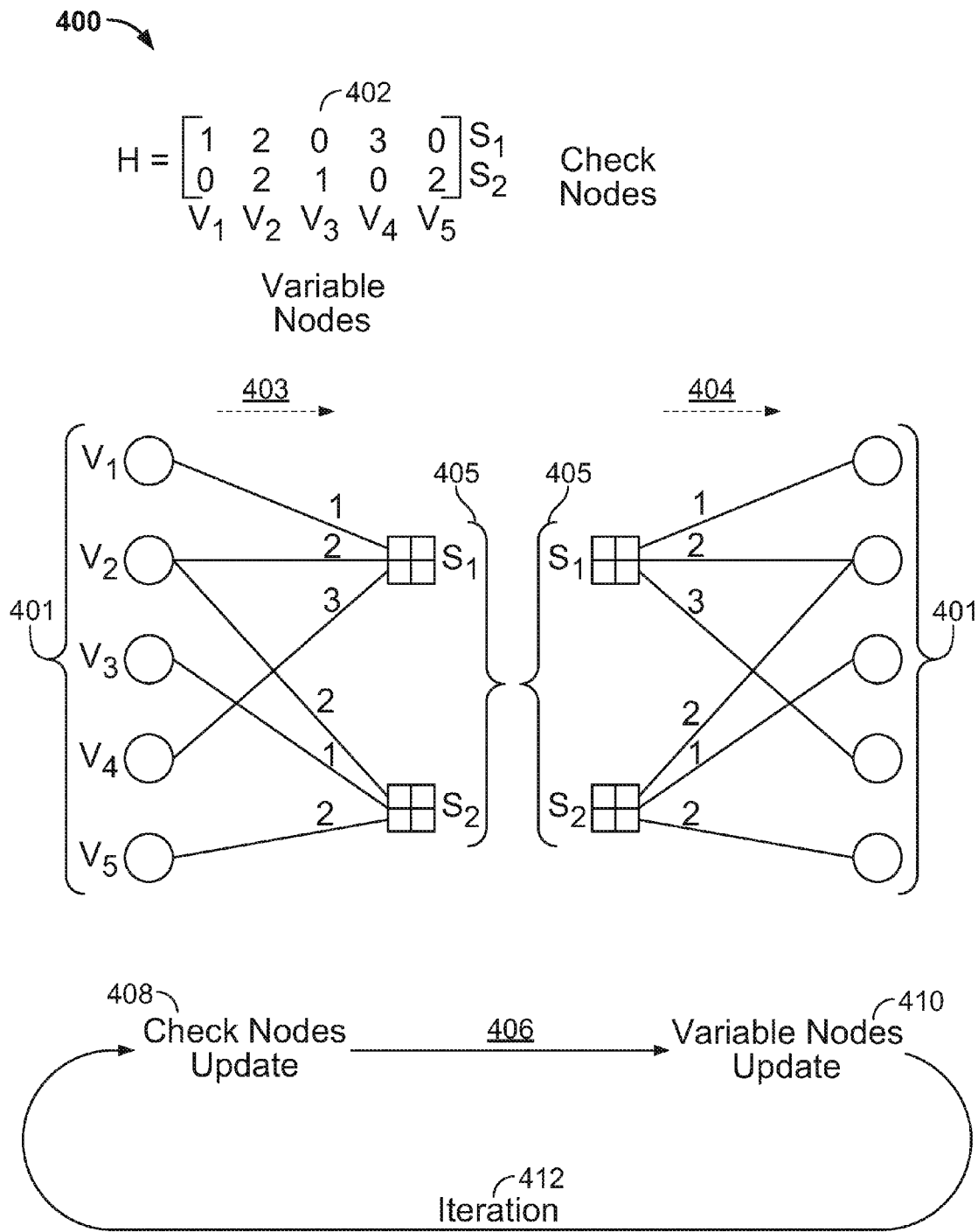
FIG. 4 shows a graphical illustration of a non-binary parity check matrix and an iterative message passing algorithm in accordance with some embodiments.

FIG. 4 shows graphical illustration 400 of non-binary parity check matrix 402 and iterative message passing algorithm 406 in accordance with some embodiments. An LDPC code may be graphically represented by a Tanner graph, a bipartite graph showing the relationship between a LDPC code's codeword symbols (equivalently variables) and parity check equations. The advantages of using a Tanner graph of a LDPC code may include access to efficient graph-based message-passing algorithms for decoding. There are two types of nodes shown in Tanner graphs 403 and 404. Variable nodes 401 represent each position in codeword 106 or received vector 114 of FIG. 1 of FIG. 1 and are denoted by circles. Thus, there may be n variable nodes. Variable nodes may also be referred to as symbol nodes. Check nodes 405 may represent each syndrome (syndrome equation or parity check equation) of LDPC code. For example, there may be n–k check nodes. Check nodes are denoted by squares.

Tanner graphs 403 and 404 correspond to parity check matrix 402. The check nodes and variable nodes of Tanner graphs 403 and 404 may correspond to the rows and columns of parity check matrix 402 (associated with a GF(4) codeword), respectively. The undirected, weighted edges connecting check nodes with variable nodes may correspond to the locations of the non-zero entries of parity check matrix 402. The weight (or, equivalently coefficient), $h_{x,y}$, on each weighted edge may correspond to the value at the (x,y) location of parity check matrix 402. For example, the "1" at the (1,1) location and the "2" at the (1,2) location of parity check matrix 402 may indicate that there is an edge of weight one between check node $S_1$ and variable node $V_1$, and that there is an edge of weight two between check node $S_1$ and variable node $V_2$, respectively. The 0 at the (2,1) location of parity check matrix 402 may indicate that there is no edge between check node $S_2$ and variable node $V_1$. Therefore, if there are $d_v$ non-zero entries in a given column of parity check matrix 402, then there are $d_v$ weighted edges emanating from the variable node corresponding to that column. Equivalently, the variable node corresponding to that column may have a degree of $d_v$. Similarly, if there are $d_c$ non-zero entries in some given row of parity check matrix 402, then there may be $d_c$ edges emanating from the check node corresponding to that row. Equivalently, the check node corresponding to that row may have a degree of $d_c$.

The check nodes (e.g. check nodes 405) of a Tanner graph may either be satisfied or unsatisfied, where a satisfied node has a value of zero and an unsatisfied node has a non-zero value. A check node may be satisfied (i.e., equal to zero), if the values at the variable nodes connected to the check node, each multiplied by their respective weight, sum to zero. In this case, multiplication and addition are defined with respect to the Galois field from which symbols for the LDPC code (or codeword) are determined. For example, check node $S_2$ of Tanner graphs 403 and 404 may be satisfied if the values at $V_2$, $V_3$, and $V_5$, multiplied by the respective weights (i.e., 2, 1, and 2, respectively) on the edges connecting these nodes to $S_2$, sum to zero. Furthermore, when a check node is unsatisfied, at least one of the variable nodes connected to it may be in error (i.e., the symbol or variable associated with the variable node is in error). Thus, the value of the check nodes (or equivalently, the value of the syndrome produced by parity check matrix 402 and the received vector) may provide a parity check on each vector received (e.g., received vector 114 of FIG. 1) by a LDPC decoder (e.g., LDPC decoder 116 of FIG. 1), thereby providing error correction capability to communication/storage system 100 of FIG. 1.

Tanner graphs 403 and 404 may be used to illustrate an iterative two-step decoding algorithm known as message passing algorithm 406 employed by, for example, LDPC decoder 116 of FIG. 1. The message passing algorithm may perform several rounds (or iterations) of message updates in accordance with the structure of the Tanner graph associated with the parity check matrix of the LDPC codes to be decoded. The message passing algorithm may be used to decode a received vector (e.g. received vector 114 of FIG. 1).

The update steps in message passing algorithm 406 employed by, for example LDPC decoder 116, may be scheduled in multiple ways. For example, each iteration 412 of message passing algorithm 406 may include processing several check nodes. For example, in the first iteration, a first subset of check nodes 405 (e.g., check nodes $S_1$ and $S_2$) may request that some of variable nodes 401, to which they are connected, send their current messages to these check nodes. Check nodes $S_1$ and $S_2$ may then perform update 408 by carrying out computations based on the messages that they receive and a set of update rules. Then, check nodes $S_1$ and $S_2$ may send their current messages to the variable nodes to which they are connected. The variable nodes connected to check nodes $S_1$ and $S_2$ (i.e. variable nodes $V_1$, $V_2$, $V_4$ and nodes $V_2$, $V_3$ and $V_5$, respectively) may then perform update 410 by carrying out computations based on the messages that they receive and a set of update rules. In this way, each iteration 412 may include a subset of check nodes 405, not already updated, that may perform update 408 and variable nodes connected to these check nodes may then perform update 410.

Iteration 412 may be repeated until either the received vector has been decoded or until a threshold number of iterations has been reached. The messages that are sent during each step of each iteration of message passing algorithm 406 may depend on the update rules and the scheduling of the update steps.

Prior to the first iteration of message passing algorithm 406, each of the variable nodes 401 of FIG. 4 may receive or compute an initial message, $L_{initial}$ (discussed above) based on/derived from the entries of a received vector (e.g., received vector 114 in FIG. 1). As discussed above, each iteration of message passing algorithm 406 may include two steps. In the first step, check nodes may update and in the second step variable nodes may update. This process may be repeated until either the received vector (or codeword) has been decoded or until a threshold number of iterations has been reached.

For example, in the first step, a group of variable nodes within the set of variable nodes 401 may send their current messages to a group of check nodes (e.g. to be processed in the first layer of message passing decoding) within the set of check nodes 405 to which they are connected. These messages may each be appropriately weighted (i.e., multiplied)

by the respective weight on the edge connecting the particular one of variable nodes 401 with a particular one of the check nodes to produce a weighted message. The group of check nodes may then perform update 408 by carrying out computations based on the weighted messages that they receive and a set of update rules. For example, these check nodes may each receive $d_c$ messages, each from a different variable node to which it is connected. Each message sent from the group of variable nodes to the group of check nodes, and appropriately weighted, may be labeled as a Q type message. Each Q type message may be in a metric vector form or a LLRV form. An a-posteriori probability (APP) message computed for any node in the group of variable nodes, and appropriately weighted, may be labeled as P type message. Each P type message may be in a metric vector form or a LLRV form. Q type or P type messages may be stored in the LDPC decoder's memory.

For example, messages sent from variable nodes to check nodes may be labeled $Q_1$ through $Q_{d_c}$. The group of check nodes may then update by computing each entry in a R type message (a vector) using each entry in the Q type message (a vector) and a min approximation. In one embodiment, using all of the Q type messages it received, each of the check nodes in the group of check nodes may compute a R type message based on the equation $$\tanh\left(\frac{R}{2}\right) = \prod_{k=1}^{d_c-1} \tanh\left(\frac{Q_k}{2}\right),$$

which may be approximated using min approximation $$R \approx \min(Q_k, \ldots, Q_{d_c-1}) \prod_{k=1}^{d_c-1} \text{sign}(Q_k).$$

In other embodiments, R type messages may be calculated using other equations/formulas (e.g., other min approximations) based on Q and/or P type messages. For example, decoders, as described in the present disclosure, may make use of any equation/formula to compute R type messages. In this case, the minimum may be with respect to the entries (equivalently components) of the Q type messages. The $Q_k$ messages (i.e. a number k of Q type messages) may be read directly from the memory of the decoder or may be reconstructed. The $Q_k$ messages may be reconstructed from the $P_k$ messages (i.e. a number k of P type messages) and the previous R type messages that may be read from the memory of the LDPC decoder. Therefore, the min approximation may be computed using P type messages in order to derive R type messages. Each R type message may be in a metric vector form or a LLRV form. The newly computed R messages may be sent to each of the variable nodes to which the check node is connected.

In the second step, a group of check nodes within the set of check nodes 405 may send their current message to a group of variable nodes within the set of variable nodes 401 to which they are connected. The group of variable nodes may then perform update 410 by carrying out computations based on the messages that they receive and a set of update rules. For example, these variable nodes may each receive $d_v$ messages each from different check nodes to which it is connected. Each message sent from the group of check nodes to the group of variable nodes may be labeled as a R type message.

For example, the messages sent from check nodes to a variable node may be labeled $R_1$ through $R_{d_v}$. The group of variable nodes may then update by computing a Q type message using each R type message it received. Specifically, using its initial message, and each of the R type messages received, each variable node of the group of variable nodes may compute a Q type message based on the equation $$Q = L_{initial} + \sum_{j=1}^{d_y-1} R_j.$$

As used herein, $L_{initial}$ may be the initial message (in LLRV form, as shown, or in metric vector form) for a particular variable node computed by the LDPC decoder or sent to the LDPC decoder by, for example, a channel detector. Similarly, message update steps may be performed to compute a P type message (also known as an a-posteriori probability (APP) message). Using its initial messages and each of the R type messages received, each variable node of the group of variable nodes may compute a P type message 515 based on the equation:

$$P = L_{initial} + \sum_{j=1}^{d_y} R_j.$$

In addition, each variable node of the group of variable nodes may also compute an extrinsic ($LLR_{EXT}$) message based on the equations:

$$LLR_{APP}(v) = L_{initial} + \sum_{j=1}^{d_y} R_j$$

and $LLR_{EXT}(v) = LLR_{APP}(v) - L_{initial}$. Some or all of these newly computed messages may or may not be sent to each of the check nodes to which the variable node is connected.

The design of message passing algorithm 406 may be modified to decode a QC-LDPC code in a more efficient manner. In particular, the schedule of update steps in message passing algorithm 406 may be altered to exploit the quasi-cyclic nature of the parity check matrix associated with the QC-LDPC code. To decode a QC-LDPC code, message passing algorithm 406 may make use of a barrel shifter.

Figure 5:
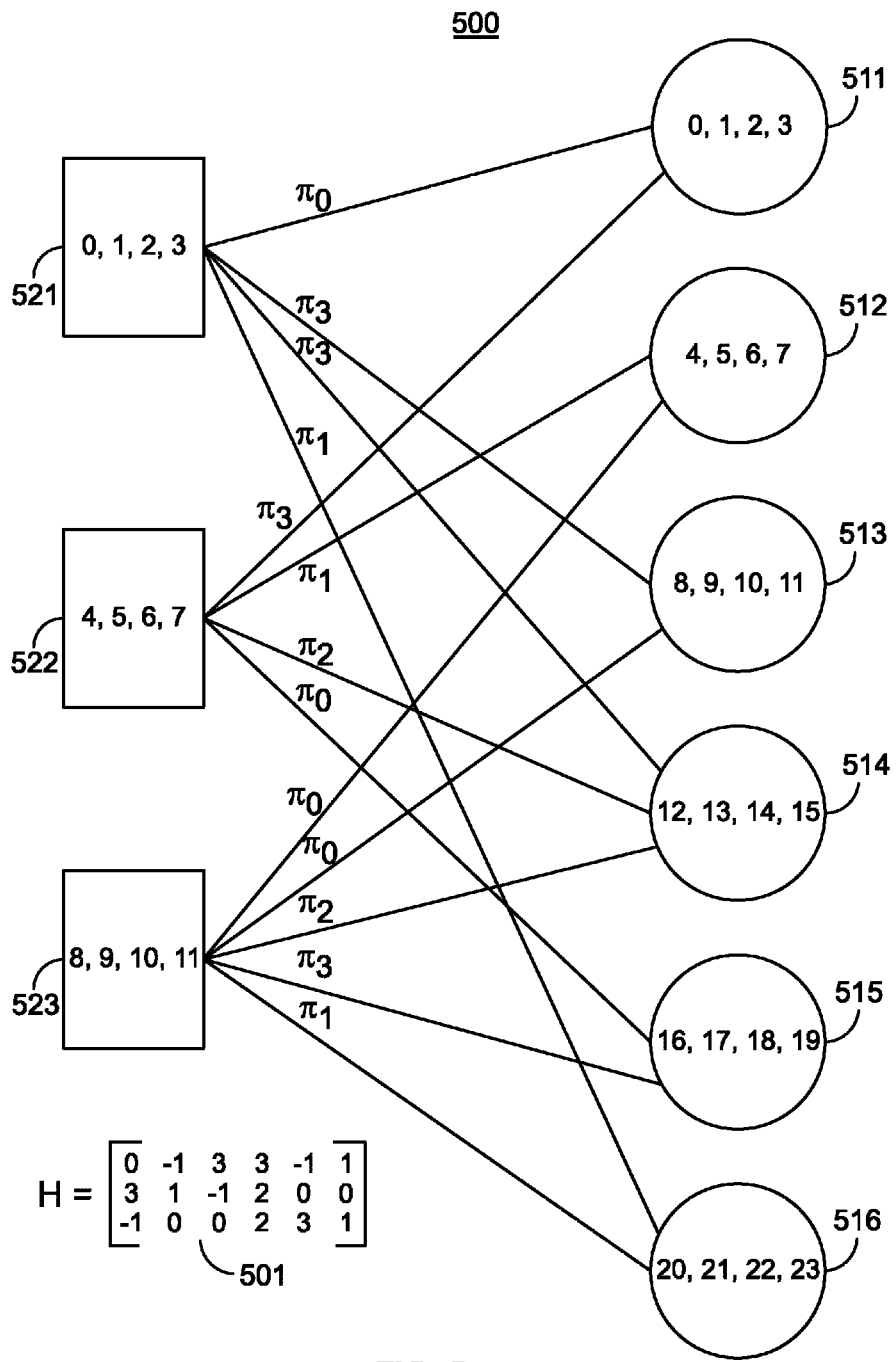
FIG. 5 shows a graphical illustration of a non-binary QC-LPDC code's non-binary quasi-cyclic parity check matrix in a mother matrix representation and a bi-partite graph illustrating the use of parallel processing in the layered approach used to decode the non-binary LDPC code in accordance with some embodiments.

FIG. 5 shows graphical illustration 500 of a non-binary QC-LPDC code's non-binary quasi-cyclic parity check matrix 501 in a mother matrix representation and a bi-partite graph illustrating the use of parallel processing in the layered approach used to decode this non-binary LDPC code in accordance with some embodiments. Graph 500 includes grouped check nodes 521, 522 and 523 and grouped variable nodes 511 512 513 514 515, and 516. The edges between the grouped check nodes and the grouped variable nodes may represent possible permutations, $\pi_i$, of a plurality of weighted edges generated based on a non-zero circulant in non-binary quasi-cyclic parity check matrix 501. In other words, the non-zero circulant may be the weighted adjacency matrix of the sub-graph of connections between each group of check nodes and each group of variable nodes. To decode a non-binary QC-LDPC code, particular layers or groups of check nodes may update in parallel. To accomplish this, check nodes associated with row in non-binary quasi-cyclic parity check matrix 501, in a mother matrix representation, may be grouped together. This process may result in grouped check nodes 521, 522, and 523. For example, check nodes associated with the first four rows of the non-binary LDPC code's parity check matrix, labeled 0, 1, 2, and 3, may be combined into grouped check nodes 521 and may be updated at substantially the same time (i.e. processed in parallel, for example, in the first layer of decoding). Variable nodes associated with a particular column in non-binary LDPC code's parity check matrix 501, in a mother matrix representation, may be grouped together. This process may result in grouped variable nodes 511 512 513 514 515, and 516.

Processing for and updating of all check nodes in grouped check nodes 521, 522, or 523 may be done in parallel. Similarly, processing for and updating of all variable nodes in grouped variable nodes 511 512 513 514 515, and 516 may also be done in parallel. To decode a non-binary LDPC code (codeword or received vector) using a layered decoding approach, the fundamental principles of message passing algorithm 406 of FIG. 4 may be used. This process of decoding a non-binary LDPC code will be explained further below.

Figure 6:
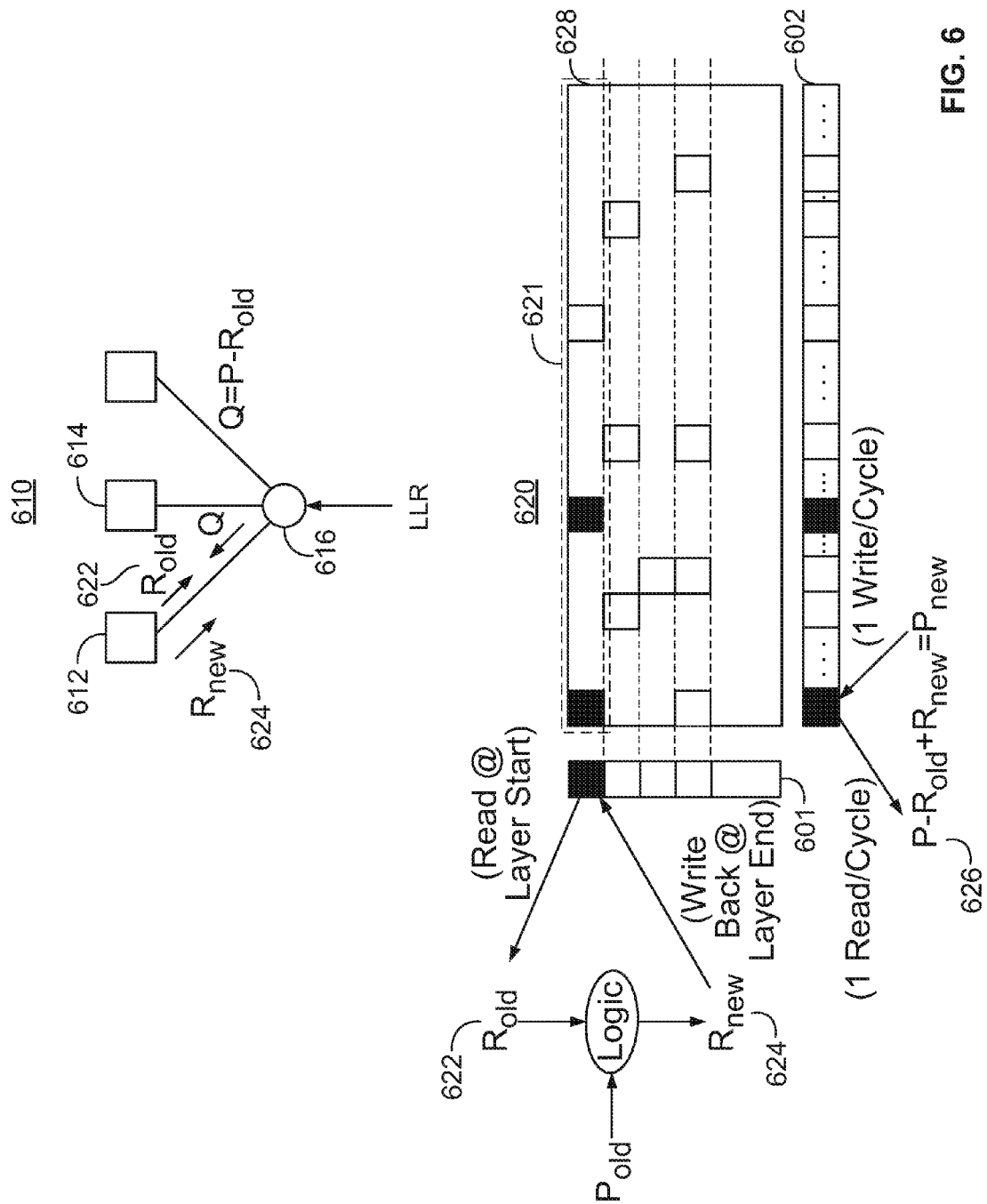
FIG. 6 shows a graphical illustration of the scheduling of update steps in the layered approach to decoding a non-binary LDPC code and a graphical illustration of reading from and writing to decoder memory when the update steps are performed in accordance with some embodiments.

FIG. 6 shows graphical illustration 610 of the scheduling of update steps in the layered approach to decoding a non-binary LDPC code (codeword or received vector) and graphical illustration 620 of reading from and writing to decoder memory when the update steps are performed in accordance with some embodiments. In illustration 610, grouped variable nodes 616 are denoted by a circle. In illustration 610 grouped check nodes 612 and grouped check nodes 614 are denoted by squares. Illustration 620 shows the reading and writing of R type and P type messages from memory and to memory when layered decoding is used. Illustration 620 shows non-binary quasi-cyclic parity check matrix 628 in mother matrix representation. Illustration 620 shows R memory 601 and P memory 602 associated with these parity check matrices. The organization of the memory locations in R memory 601 and P memory 602 may be governed by a parity check matrix in a mother matrix representation.

Each square within R memory 601 may represent a memory location for data used to derive R type messages (e.g. R type messages 624 or R type messages 622) of grouped check nodes represented by a row of the non-binary quasi-cyclic parity check matrix in a mother matrix representation (e.g. non-binary parity check matrix 628). For example, each memory location may contain data such as Min1 (M' or $\mu_1$), Min1Index (i'), Min2 (M" or $\mu_2$), and an AccumulatedSign (s), in addition to other data. Min1 may correspond to the entry-wise (equivalently, component-wise) minimum of all P type messages associated with non-zero circulants in the corresponding row of the non-binary quasi-cyclic parity check matrix in a mother matrix representation and Min1Index may be the column location of this P type message. Similarly, Min2 may correspond to the second entry-wise (equivalently, component-wise) minimum of all P type messages associated with non-zero circulants in the corresponding row of the non-binary quasi-cyclic parity check matrix in a mother matrix representation. The value of AccumulatedSign may be the entry-wise (equivalently, component-wise) sum of the signs of all P type messages associated with non-zero circulants in the corresponding row of the non-binary quasi-cyclic parity check matrix in a mother matrix representation. The minimum of all P type messages may be taken once the P type messages are adjusted (e.g., by subtracting an old R type message, Rold, from each P type message $Q:=P-R_{old}$ and determining the minimum amongst these Q messages). Data such as Min1 (M' or $\mu_1$), Min1Index (i'), Min2 (M" or $\mu_2$), and an AccumulatedSign (s), as well as other stored data, may be used to derive an R type message (e.g. as discussed above). In performing a comparison between P and/or Q type messages (e.g., while computing R type messages) or any other messages, the metric vector form of these messages may be most computationally efficient. Therefore, the metric vector form of these messages may be used while an R type message is computed and/or derived. Each square within P memory 602 may represent memory locations for the P type messages (e.g. P type messages 626) of grouped variable nodes represented by a column of the non-binary quasi-cyclic parity check matrix in a mother matrix representation (e.g. parity check matrix 628). The equations discussed above, with reference to the message passing algorithm, may be used to derive P and/or Q type messages (e.g. based on a summation operation involving R type messages). In performing an arithmetic operation on R type messages or any other messages, the LLRV form of these messages may be most computationally efficient. Therefore, the LLRV form of these messages may be used while P and/or Q type messages are computed and/or derived. In performing the update steps in the layered approach to decoding a non-binary LDPC code, R, P, and/or Q type messages may be read from or written to various decoder memory locations. These messages may be read from or written to decoder memory in LLRV form, metric vector form, or any other form. The messages may be converted between forms prior to, after, or during the reading or writing of these messages.

Each row of non-binary quasi-cyclic parity check memory matrix 628 may correspond to both grouped check nodes as well as a layer to be processed during layered decoding. For example, during layered decoding the first row of non-binary quasi-cyclic parity check matrix 628 may be processed. The data in the memory location corresponding to the first row of parity check matrix 628 may be read from R memory 601, prior to the grouped check nodes corresponding to the first row have updated, and previous R type messages 622, $R_{old}$, may be derived from the stored data. After the grouped check nodes corresponding to the first row of parity check matrix 628 have updated, the data in the memory location corresponding to the first row of parity check matrix 628 may then be read from R memory 601 and R type messages 624, $R_{new}$, may be derived from this data. P type messages 626 in the first column in P memory 602 may be read from memory. These messages may be associated with the column containing the first non-zero circulant in the first row of parity check matrix 628.

Using this information, each of the variable nodes in the grouped variable nodes associated with the first column of parity check matrix 628 may each compute a P type or a Q type message. For example, each of these variable nodes may compute the a-posteriori probability P type message (initially, prior to the start of the decoding process, P may be set to the initial message for the variable node $L_{initial}$). These variable nodes may compute $Q:=P-R_{old}$ and $P_{new}:=Q+R_{new}$ Prior to computing Q, the P message may have to be circularly shifted to align the P and $R_{old}$ messages. This may be done, for example, using the barrel shifter used by the layered LDPC decoder.

The grouped variable nodes associated with the first column of parity check matrix 628 may then store the computed $P_{new}$ messages in the associated location in P memory 602. These $P_{new}$ messages may be sent to grouped check nodes associated with a row of parity check matrix 628 (i.e., a layer being processed). Using the $P_{new}$ messages, these grouped check nodes may update and buffer the data used for computing R type messages.

Figure 7:
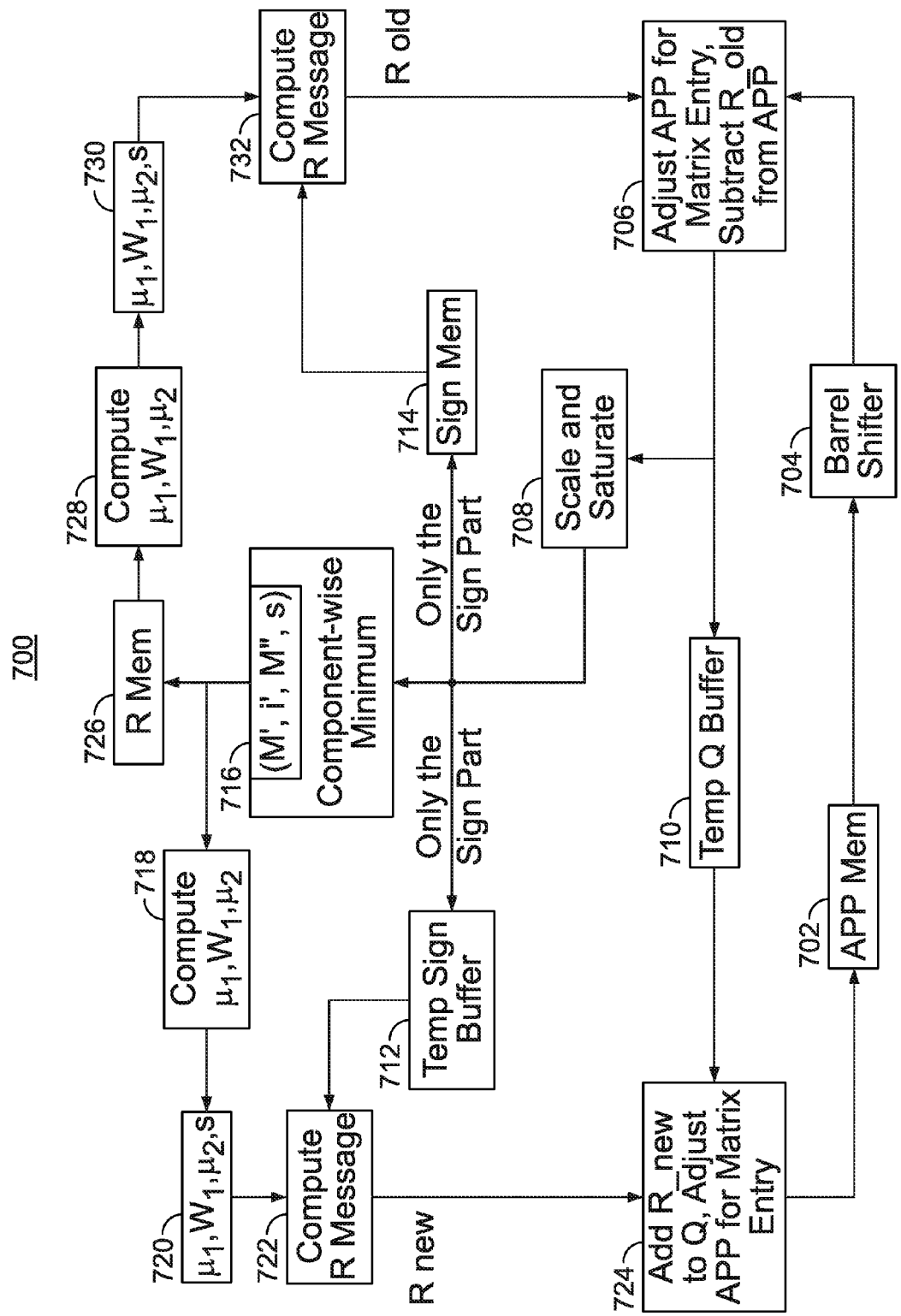
FIG. 7 shows a simplified block flow diagram of the operation of a layered non-binary LDPC decoder in accordance with some embodiments.

FIG. 7 shows a simplified block flow diagram of the operation of layered non-binary LDPC decoder 700 in accordance with some embodiments. Non-binary LDPC decoder 700 may process and decode LDPC codes (received vectors) using a layered approach to decoding. Non-binary LDPC decoder 700 (which may be similar to LDPC decoder 116 of FIG. 1) includes APP memory 702, barrel shifter 704, APP adjustment block 706, scale and saturate block 708, temporary Q buffer block 710, temporary sign buffer block 712, sign memory 714, component-wise minimum computation block 716, computation blocks 718 and 720, compute R message block 722, APP adjustment block 724, R memory 726, computation blocks 728 and 730, compute R message block 722, and additional components (not shown) used to decode a received LDPC vector (e.g. received vector 114 of FIG. 1).

APP memory 702 initially receives and stores channel information, such as the initial message, $L_{initial}$, for each variable in the received vector computed by the decoder or received by the decoder from, e.g., a channel detector. In addition, APP memory 702 stores P type messages and outputs the appropriate P type message to barrel shifter 704. Barrel shifter 704 cyclically shifts and aligns the P type message it receives from APP memory 702 so that the P type message is aligned with the appropriate R type message (from the appropriate check grouped node), $R_{old}$ (e.g. R type message 622 of FIG. 6). Barrel shifter 704 then outputs this message to APP adjustment block 706. Using an $R_{old}$ message it receives from compute R message block 732 and the P type message from barrel shifter 704, APP adjustment block 706 computes a Q type message using Q:=P–$R_{old}$, as discussed above. APP adjustment block 706 then outputs this Q type message to scale and saturate block 708 and temporary Q buffer block 710.

Scale and saturate block 708 may scale (by multiplying by a scale factor that may be any numerical value) and/or saturate the entries of the Q type message it receives from APP adjustment block 706 and output the result to temporary sign buffer block 712, sign memory 714, and component-wise minimum computation block 716. Temporary Q buffer block 710 temporarily stores the Q type message it receives from scale and saturate block 708 for use at an appropriate time. For example, temporary Q buffer block 710 delays and stores the Q type message until it outputs this message to APP adjustment block 724 for the computation of a P type message. Temporary sign buffer block 712 temporarily stores the sign (for each entry) of the Q type message it receives from scale and saturate block 708 until it outputs this information to compute R message block 722, for the computation of a R type message. Similarly, sign memory 714 stores the sign (for each entry) of the Q type message it receives from scale and saturate block 708 and outputs this information to compute R message block 732 for the computation of a R type message.

Component-wise minimum computation block 716 computes data such as entry/component-wise minimums of the Q type messages it receives from scale and saturate block 708 and other data used to derive R type messages and outputs this data to computation block 718 and R memory 726. For example, component-wise minimum computation block 716 may calculate the data Min1 (M'), Min1Index (i'), Min2 (M"), and an AccumulatedSign (s). These may be intermediate data values and further processing of this data may be necessary to derive similar data values for an entire layer associated with the layered decoding approach. Computation blocks 718 and 720 uses the data received from component-wise minimum computation block 716 to compute other data (e.g., $\mu_1$, $W_1$, i', $\mu_2$, and/or s), for a layer associated with the layered decoding approach. The blocks use the computed data to derive R type messages and output this data to compute R message block 722. Compute R message block 722 selects the appropriate data from computation blocks 718 and/or 720 and uses this data to derive the R type message, $R_{new}$, described above, which is output to APP adjustment block 724. APP adjustment block 724 adds the Q type message it receives from temporary Q buffer 710 with the R type message, $R_{new}$, it receives from compute R message block 722 using P:=Q+$R_{new}$, as discussed above. APP adjustment block 724 then outputs this computed P type message to APP memory 702 to be stored.

R memory 726 stores the data used to derive R type messages that it receives from component-wise minimum computation block 716, and outputs this data to computation block 728. Computation blocks 728 and 730 use the data they receive from R memory 726 to compute other data (e.g., $\mu_1$, $W_1$, i', $\mu_2$, and/or s), for a layer associated with the layered decoding approach. These blocks use the computed data to derive R type messages and output this data to compute R message block 732. Compute R message block 732 selects the appropriate data from computation blocks 728 and/or 730 and uses this data to derive the R type message, $R_{old}$ described above, which is output to APP adjustment block 706.

In some embodiments, non-binary LDPC decoder 700 includes a format converter (not shown). The format converter may be a stand-alone component or may be a part of any of the aforementioned components of non-binary LDPC decoder 700. The format converter is used to convert P, Q, and/or R type messages and/or any other type of soft information (e.g., an initial message) between a LLRV form and a metric vector form in order to efficiently process and decode a received vector. Conversion between metric vector form and LLRV form may be performed as described above with respect to FIGS. 2B and 2C. For example, when a comparison operation is to be performed on messages (e.g., when comparing P and/or Q type messages to determine entry-wise minimum values and/or minimal message values, to compute R type messages), it may be most efficient to use messages in the metric vector form. Therefore, messages may be converted from metric vector form to metric vector form prior to performing comparison operation in the decoder (e.g., prior to the operation of component-wise minimum computation block 716). When an arithmetic operation is to be performed on messages (e.g., when computing P and/or Q type messages or performing a summation operation using messages), it may be most efficient to use the LLRV form. Therefore, messages may be converted from metric vector form to LLRV form prior to performance of an arithmetic operation in the decoder (e.g., prior to or during the operation of APP adjustment blocks 706 and/or 724).

Figure 8:
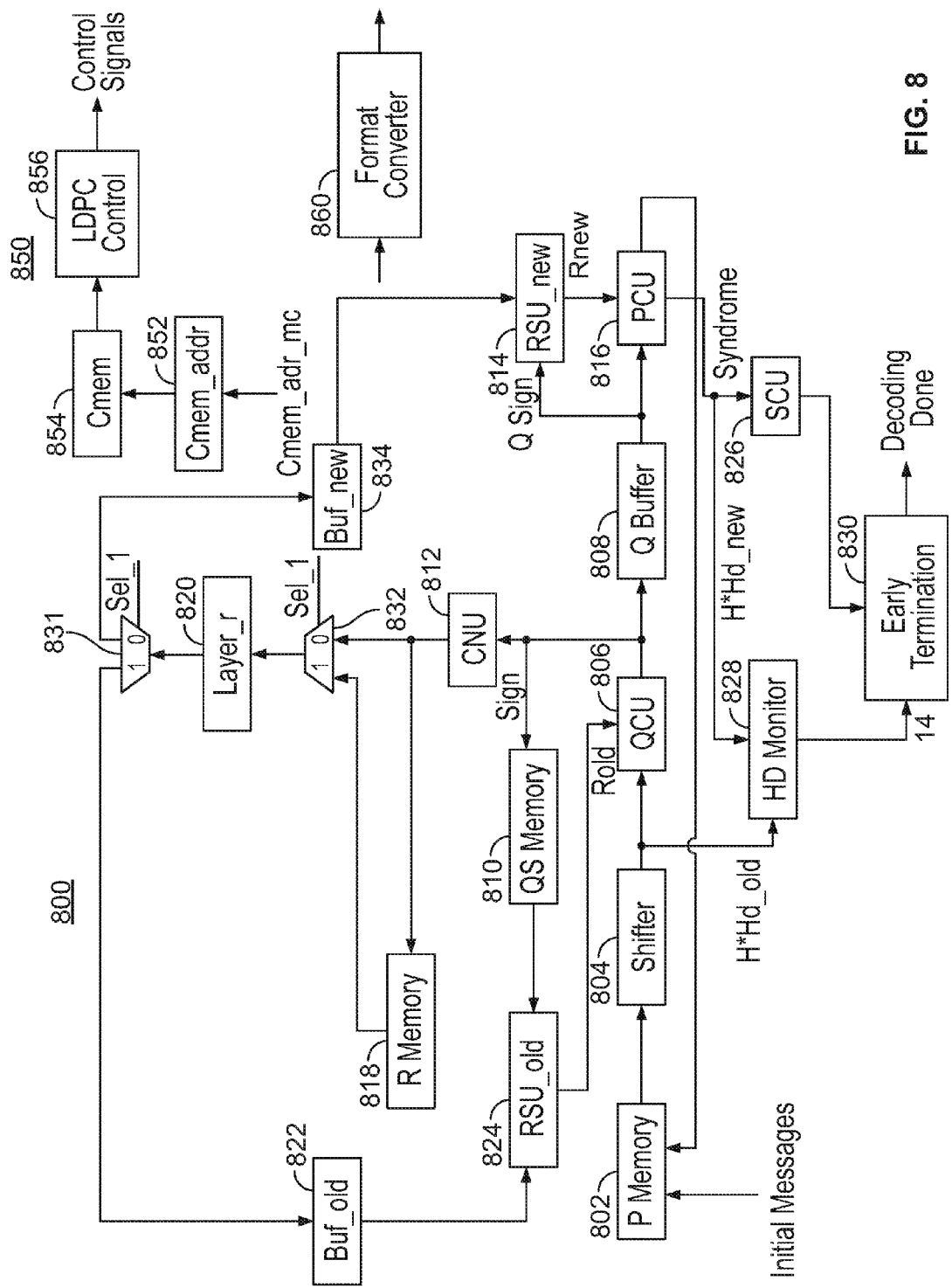
FIG. 8 shows a simplified application specific integrated circuit (ASIC) block diagram of a layered non-binary LDPC decoder in accordance with some embodiments.

FIG. 8 shows a simplified ASIC block diagram of layered non-binary LDPC decoder 800 in accordance with some embodiments. Non-binary LDPC decoder 800 may be used to decode a received vector using a layered approach to decoding (e.g., using min-sum decoding). Non-binary LDPC decoder 800 (which may be similar to LDPC decoder 116 of FIG. 1 and non-binary LDPC decoder 700 of FIG. 7) includes P memory 802, shifter 804, Q Computation Unit (QCU) 806, Q buffer 808, Q memory 810, Check Node Unit (CNU) 812, R Select Unit (RSU_new) 814, P Computation Unit (PCU) 816, R memory 818, Layer_r block 820, buffer 822, R Select Unit (RSU_old) 824, Syndrome Computation Unit (SCU) 826, Hard Decision (HD) monitor 828, early termination block 830, demultipexer 831, multiplexer 832, buffer 834, and additional components (not shown) used to decode a received LDPC vector (e.g. received vector 114 of FIG. 1).

Decoder 800 may have several pipelines to allow it to have a high throughput (e.g., about or greater than 7 gigabits per second, Gbps).

In some embodiments, non-binary LDPC decoder 800 may include LDPC decoding control 850. Decoding control 850 may be used for step-by-step scheduling and control of, a non-binary LDPC decoder (e.g., layered non-binary LDPC decoder 800). Decoding control 850 may schedule and control the operation of each of the components of LDPC decoder 800 (including each of the components in the decoder used to process P, Q, and/or R type messages and decode a received vector). Decoding control 850 may include control memory address register 852, control memory 854, and controller 856.

In some embodiments, non-binary LDPC decoder 800 may include format converter 860. In some embodiments, format converter 860 may be a stand-alone component within LDPC decoder 800. In some embodiments, format converter 860 may be a part of and/or internal to any of the components within non-binary LDPC decoder 800. Format converter 860 converts P, Q, and/or R type messages and/or any other type of soft information between LLRV form and metric vector form.

P memory 802 initially receives and stores channel information, such as the initial message, $L_{initial}$, for each variable in the received vector computed by the decoder or received by the decoder from, e.g., a channel detector. In addition, P memory 802 stores P type messages and outputs the appropriate P type message to shifter 804. Shifter 804 cyclically shifts and aligns the P type message it receives from P memory 802 so that the P type message is aligned with the appropriate R type message (from the appropriate check grouped node), $R_{old}$ (e.g. R type message 622 of FIG. 6). Shifter 804 outputs this message to QCU 806 and to HD monitor 828. Using an $R_{old}$ message it receives from RSU_old 824 and the P type message from shifter 804, QCU 806 computes a Q type message using $Q:=P-R_{old}$ (which is passed from a variable node to a check node), as discussed above. QCU 806 then outputs this Q type message to Q buffer 808, Q memory 810, and CNU 812. Q buffer 808 temporarily stores the Q type message it receives from QCU 806 for use at an appropriate time. For example, Q buffer 808 delays and stores the Q type message until it outputs this message to PCU 816 for the computation of a P type message. Q buffer 808 also outputs the sign (for each entry) of the Q type message to RSU_new 814. Q memory 810 stores the Q type messages it receives from QCU 806 and outputs a Q type message to RSU_old 824 when necessary.

CNU 812 computes data such as entry/component-wise minimums of the Q type messages it receives from QCU 806 (e.g., using a comparison operation) as well as other data used to derive R type messages. For example, CNU 812 may calculate the data Min1 (M'), Min1Index (i'), Min2 (M''), and an AccumulatedSign (s), described above. CNU 812 outputs the data that it computes to R memory 818 and a data input of multiplexer 832. In some embodiments, CNU 812 may also output the Q type messages it receives from QCU 806 to a data input of multiplexer 832. RSU_new 814, selects the appropriate data from buffer 834 and the information it receives from Q buffer 808 to derive the R type message, $R_{new}$, described above, which is output to PCU 816. PCU 816 adds the Q type message it receives from Q buffer 808 with the R type message, $R_{new}$, it receives from RSU_new to compute a P type message using $P:=Q+R_{new}$, as discussed above. PCU 816 then outputs this computed P type message (a variable node message) to P memory 802 to be stored and to SCU 826. R memory 818 stores the data used to derive R type messages that it receives from CNU 812, and outputs this data to a data input of multiplexer 832.

Layer_r block 820 computes the minimal and second minimal Q type messages and the location of these minimal Q type messages from information it receives from multiplexer 832. These computations may be used to derive an R type message using, as discussed above. Layer_r block 820 outputs the result of its computations to demultiplexer 831. Layer_r block 820 may be used on two paths of decoder 800 to save implementation cost in the decoder. Buffer 822 may receive one of the data outputs of demultiplexer 831, (i.e., the results of the computations from Layer_r block 820) and may temporarily store the data it receives for use at a n appropriate time, until this data is output to RSU_old 824. RSU_old 824 selects the appropriate data from buffer 822 and the information it receives from Q memory 810 to derive the R type message, $R_{old}$ described above, which is output to QCU 806. SCU 826 computes a syndrome (e.g., syndrome 216 of FIG. 2A) of each layer's decoding result based on P type messages it receives from PCU 816. During the computation of the syndrome, SCU 826 may determine whether each layer's decoding result satisfies the check equations associated with that layer (e.g., the decoding result indicates a zero syndrome). SCU 826 provides its results to early termination block 830. HD monitor 828 receives a P type message from PCU 816 and a corresponding P type message from P memory 802 and determines a hard decision value (a variable value) for the variable associated with the P type message. HD monitor 828 may output its determination to early termination block 830. SCU 826 and HD monitor 828 may be used to determine the quality of decoding in decoder 800. Early termination block 830 may indicate to a top-level decoder 800 controller (e.g., controller 856) that decoder 800 converged to a valid codeword based the syndromes (e.g., if all computed syndromes are equal to zero and/or if the output of HD monitor 828, associated with a received vector, is determined to be a valid codeword).

Decoding control 850 may include control memory address register 852, control memory 854, and controller 856. Memory address register 852 receives an input instruction number and determines an address to be used to select an appropriate instruction from control memory 854. Memory address register 852 outputs the address that it determines to control memory 854. Control memory 854 receives an address from memory address register 852 and outputs to controller 856 an instruction at the received address location in memory. Control memory 854 may be reprogrammable. Control memory 854 is used to store one or more instructions related to operation of layered non-binary LDPC decoder 800. In particular, the instructions may be used to schedule and control the operation of each of the components of non-binary LDPC decoder 800 (e.g., including each of the components in the decoder used to process P, Q, and/or R type messages and decode a received vector). Control memory 854 may store instructions for one iteration of decoder 800 and may reuse these instructions for other iterations.

Controller 856 may receive instructions from control memory 854 and provide output signals that are used control the operation of layered non-binary LDPC decoder 800 and its components based on the received instructions. The ease of implementation of decoding control 850 may be advantageous in the design of non-binary LDPC decoder 800. For example, decoding control 850 (which may be used to control pipelines of information between or within the components of decoder 800) may be easier to implement then a state-machine based control.

Decoding control 850 may store instructions and perform step-by-step scheduling for and control the operation of non-binary LDPC decoder 800 using these instructions. Each instruction may make use of several field names. For example, the following table provides some of the field names, the number of bits used for storing the information related to the field, and a description of the use of the field:

| Field name | Bit width | Description |
| --- | --- | --- |
| DELTA_SHIFT_0, DELTA_SHIFT_1, DELTA_SHIFT_2, DELTA_SHIFT_3 | 5 | Specifies a delta shift amount for a shifter |
| PA_0, PA_1, PA_2, PA_3 | 7 | P memory address |
| H_0, H_1, H_2, H_3 | 2 | Specifies a non-zero circulant entry location in a parity check matrix |
| LAYER_END | 1 | Provides an indication of the end of a layer of decoding |

By way of example, decoding control 850 may provide instructions to control shifter 804, which shifts and aligns the P type message it receives as described above. The instructions may specify a delta shift using the fields as specified in the table above. The delta shift fields above may be coded using five binary bits: b4, b3, b2, b1, and b0. Here, b4=1 may imply a shift of 12, b3=1 may imply a shift of 6, b2=1 may imply a shift of 4, b1=1 may imply a shift of 2, and b0=1 may imply a shift of 1. For example [b4, b3, b2, b1, b0]=[1, 0, 0, 1, 1] may imply a shift of 15. A shifting operation may have to be performed on a message when LDPC decoding of a received vector is performed, when an initial set of messages is computed by the non-binary LDPC decoder (e.g., LDPC decoder 800 of FIG. 8), and/or when an initial set of messages received (e.g., by a channel detector such as a SOVA channel detector) by a non-binary LDPC decoder. The shift of the messages may be accumulated (in stages) from the start of processing of a layer (in a layered approach to decoding used by the non-binary LDPC decoder) to the end of processing the layer.

As another example, instructions may be provided by decoding control 850 to read and write messages to and from P memory (e.g., P memory 802). A P_wr_addr instruction may be used to write a P type message, P_new, back into P memory. A instruction, p_wr_addr_circ(i), where, for example, i=1, 2, 3, or 4 may be used to delay reading of P type message from P memory. The reading of an old P type message may be delayed by a number, n (e.g., n=16) clock cycles in the decoder to align it with an updated P type message. For example, the instructions to read and write P type message from P memory may take the form:
p_addr_circ1={PA_0, 2'b00},
p_addr_circ2={PA_0, 2'b01},
p_addr_circ3={PA_0, 2'b10},
p_addr_circ4={PA_0, 2'b11},
p_rd_addr_circ1=p_addr_circ1,
p_rd_addr_circ2=p_addr_circ2,
p_rd_addr_circ3=p_addr_circ3, and
p_rd_addr_circ4=p_addr_circ4

As yet another example, instructions may be provided by decoding control 850 to mark (e.g., set to one) the end of a layer bit in control memory 854 (which indicates the end of processing of a layer in decoder 800) a number n1 cycles (e.g., clock cycles) ahead of the actual end of a layer. Marking the end of a layer bit may trigger a read operation in the decoder and may allow for a delay (e.g., for R type messages) of n1 cycles until the actual end of processing of a layer in the decoder. In addition, instructions may be provided so that a counter, counter_idx, may be cleared at the actual end of a layer and may be incremented by one when the address in control memory 854 is incremented by one. For example, these instructions may take the form:
Nzc_idx_circ1={counter_idx, 00},
Nzc_idx_circ2={counter_idx, 01},
Nzc_idx_circ3={counter_idx, 10}, and
Nzc_idx_circ4={counter_idx, 11}.

As yet another example, instructions may be provided by decoding control 850 that specify a value for h_edge, which may be substantially similar to weight (or, equivalently coefficient), $h_{x,y}$, discussed above. In addition, when h_edge=0 (or $h_{x,y}$=0) it may act as a flag to disable a particular circulant and may cause decoding control 850 to generate the control signals cnu_en_circ(i), rsu_en_circ(i) (new and old), and p_rd_en, p_wr_en(i) for i=1, 2, 3, 4, in addition to hd_check_en, syndrome_check_en, and shift_accumulate_en. Decoding control 850 may also provide instructions to delay (a number of clock cycles) information in the pipelines that operate between or within components of decoder 800.

In some embodiments, format converter 860 may be a stand-alone component within LDPC decoder 800. In some embodiments, format converter 860 may be a part of and/or internal to any of the components within non-binary LDPC decoder 800. Format converter 860 may be used to convert P, Q, and/or R type messages and/or any other type of soft information (e.g., an initial message) between LLRV form and metric vector form. Format converter 860 may receive at its input soft information (e.g., P, Q, and/or R type and/or initial messages) in either metric vector form or LLRV form and may output the soft information in the other form. Conversion between metric vector form and LLRV form may be performed as described above with respect to FIGS. 2B and 2C.

It may be necessary to convert soft information within the decoder (e.g., P, Q, and R type messages computed within the decoder or messages received by the decoder) between LLRV form and metric vector form in the process of decoding a received vector. Format converter 860 may be used for the conversion of the soft information/messages from LLRV form to metric vector form or from metric vector form to LLRV form. For example, when a comparison operation is to be performed on messages (e.g., when computing R type messages, entry-wise minimum values, and/or minimal message values), it may be most efficient to use messages in the metric vector form. Therefore, messages may be converted from LLRV form to metric vector form prior to performance of a comparison operation in the decoder. When an arithmetic operation is to be performed on messages (e.g., when computing P and/or Q type messages, or performing a summation operation using messages), it may be most efficient to use the LLRV form. Therefore, messages may be converted from metric vector form to LLRV form prior to performance of an arithmetic operation in the decoder.

Figure 9:
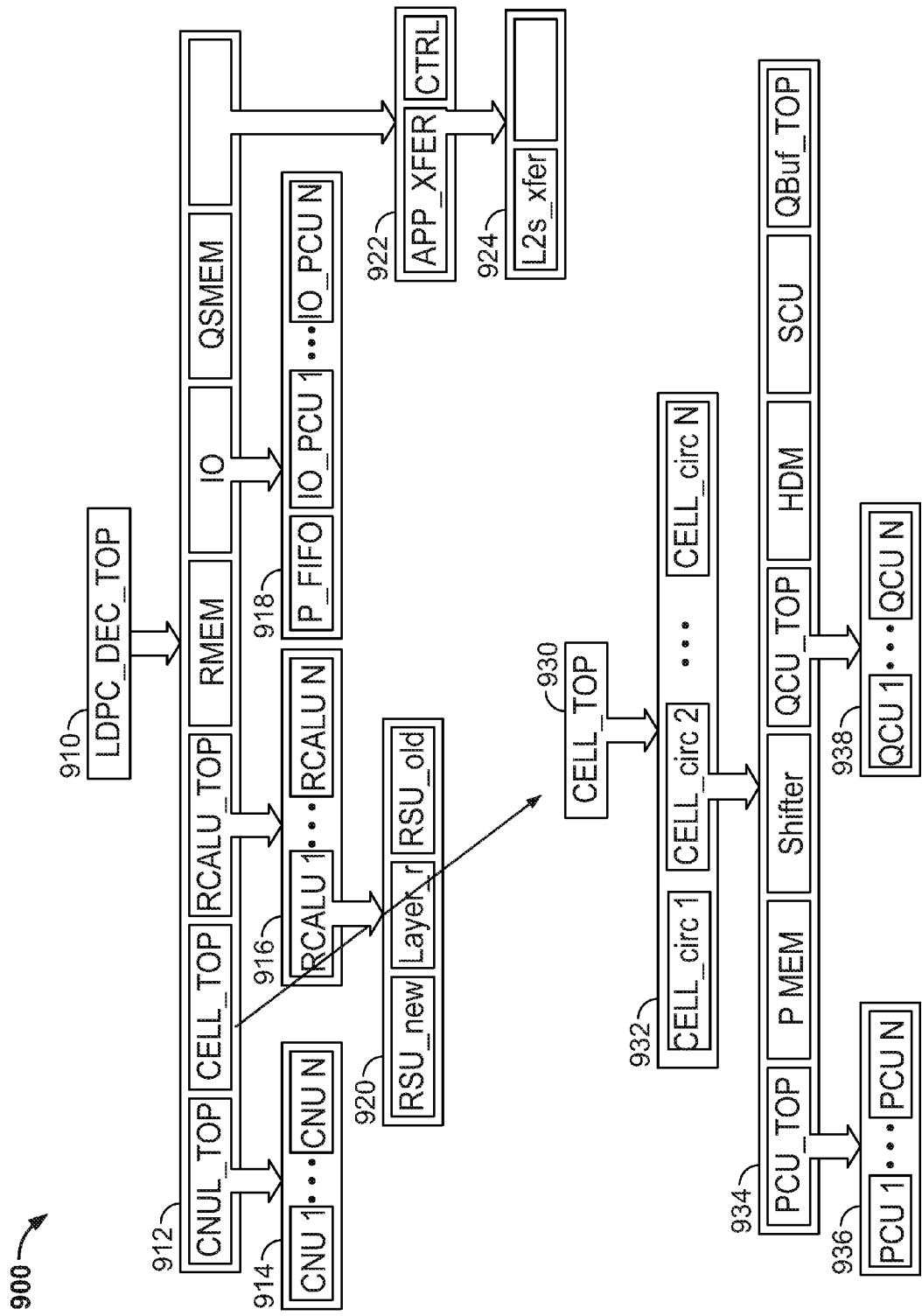
FIG. 9 shows an example of a hardware implementation hierarchy of a non-binary LDPC decoder in accordance with some embodiments.

FIG. 9 shows an example of hardware implementation hierarchy 900 of non-binary LDPC decoder 800 of FIG. 8 in accordance with some embodiments. There are multiple levels of hierarchy in the example of hardware implementation hierarchy 900. For example, exemplary hardware implementation hierarchy 900 includes levels 910, 912, 914, 916, 918, 920, 922 and 924, each of which may include several components. In addition, the hardware implementation hierarchy 900 may include an implementation hierarchy for each component at each level of hierarchy 900. For example, the cell top at level 912 of hierarchy 900 may include levels 930, 932, 934, 936, and 938, each of which includes several components.

Level 910 includes a LDPC decoder top, which may be substantially similar in operation and implementation to LDPC decoder 800 of FIG. 8. The LDPC decoder top is at the head of hardware implementation hierarchy 900. The LPDC decoder top has an interface to communicate with components at level 912. Level 912 includes a check node unit top (CNUL_TOP), a cell top (CELL_TOP), a R calculate unit top (RCALU_TOP), a R memory (RMEM), an input/output unit (IO), a Q memory (QSMEM), and a scheduler.

The check node unit top may have an interface to communicate with components at level 914, which may include several check node units (CNUs), each for a different check node. The check node unit top and/or the several check node units at level 914 may each be substantially similar in operation and implementation to CNU 812 of FIG. 8.

The R calculate unit top may have an interface to communicate with components at level 916, which may include several R calculate units (RCALCUs). The R calculate unit top and/or the several R calculate units at level 916 may each be substantially similar in operation and implementation to RSU_new 814 and/or RSU_old 824 of FIG. 8. The R memory may be substantially similar in operation and implementation to R memory 818 of FIG. 8.

The input/output unit may have an interface to communicate with components at level 918, which may include several P computation input/output units (IO_PCUs) and a P first-in-first-out queue (P_FIFO). The input/output unit, the several P computation input/output units, and the P first-in-first-out queue at level 916 may each operate to provide input and output from P computation units such as, e.g., PCU 816 of FIG. 8.

The scheduler may have an interface to communicate with components at level 922, which may each have an interface to communicate with components at level 924. Level 922 may include an APP transfer unit (APP_XFER) and a controller. Level 924 may have L2s and S2I transfer units (L2s_xfer and S2I_xfer, respectively). The scheduler, and the components at levels 922 and 924 may be substantially similar in operation and implementation to decoding control 850 of FIG. 8.

The cell top at level 930 may have an interface to communicate with components at level 932, which may each have an interface to communicate with the components at level 934. Level 932 may include several non-zero circulant processing units (CELL_circs), each of which may be a non-zero circulant in a LDPC parity check matrix (e.g., non-binary quasi-cyclic parity check matrix 310 of FIG. 3, in a mother matrix representation). Level 934 may include several sets of components, each for one of the several non-zero circulant processing units at level 932. In particular, level 934 may include a P computation unit top (PCU_TOP), a P memory (P MEM), a shifter, a Q computation unit top (QCU_TOP), a hard decision monitor (HDM), a syndrome computation unit (SCU), and a Q buffer top (QBuf_TOP).

The P computation unit top may have an interface to communicate with components at level 936, which may include several P computation units (PCUs). The P computation unit top and the several P computation units at level 936 may each be substantially similar in operation and implementation to PCU 816 of FIG. 8. The P memory may be substantially similar in operation and implementation to P memory 802 of FIG. 8. The shifter may be substantially similar in operation and implementation to shifter 804 of FIG. 8.

The Q computation unit top may have an interface to communicate with components at level 938, which may include several Q computation units (QCUs). The Q computation unit top and the several Q computation units at level 938 may each be substantially similar in operation and implementation to QCU 806 of FIG. 8. The hard decision monitor may be substantially similar in operation and implementation to HD monitor 828 of FIG. 8. The a syndrome computation unit may be substantially similar in operation and implementation to SCU 826 of FIG. 8. The Q buffer top may be substantially similar in operation and implementation to Q buffer 808 of FIG. 8.

Figure 10:
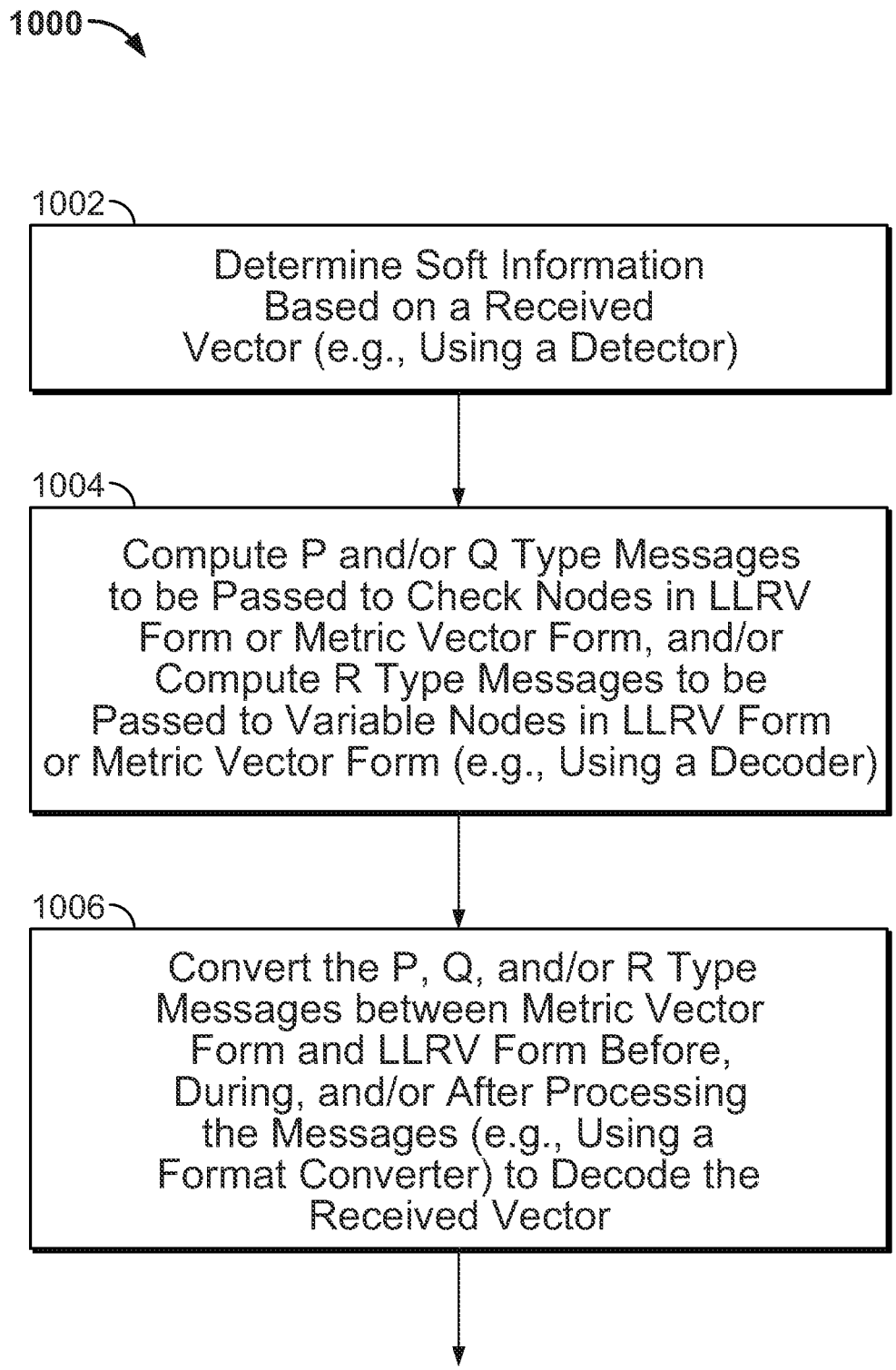
FIG. 10 shows a flowchart of a process for decoding a received vector using a non-binary decoder in accordance with some embodiments.

FIG. 10 shows a flowchart of process 1000 for decoding a received vector using a non-binary decoder in accordance with some embodiments. Process 1000 includes 1002, 1004, and 1006. Process 1000 may be executed by, for example, a non-binary LDPC decoder (e.g. LPDC decoder 700 of FIG. 7).

At 1002, an initial set of messages or any other type of soft information may be computed by a decoder (e.g., LDPC decoder 116 of FIG. 1, non-binary LDPC decoder 700 of FIG. 7, or non-binary LDPC decoder 800 of FIG. 8) or sent to a decoder by, for example, a channel detector. In particular, as discussed above, these messages may be derived from a received vector and may be in LLRV form or metric vector form. For example, for GF(4) codewords, the decoder may compute or receive an initial message in LLRV form using the equation $$L_{initial}(v_i) = \left[\log\left(\frac{P(v_i = 0)}{P(v_i = 1)}\right), \log\left(\frac{P(v_i = 0)}{P(v_i = 2)}\right), \log\left(\frac{P(v_i = 0)}{P(v_i = 3)}\right)\right]^T$$

for each i, where $v_i$ may represent the variable associated with the $i^{th}$ entry in a (e.g., received vector 114 of FIG. 1). Next, 1004 may be executed.

At 1004, P, Q, and/or R type messages and/or any other type of soft information may be computed in LLRV form or in metric vector form. P and/or Q type messages may be computed (by variable nodes), for example, in an iterative message passing algorithm and/or while using a layered approach to decoding a received vector (or code) using a decoder (e.g., LDPC decoder 116 of FIG. 1, non-binary LDPC decoder 700 of FIG. 7, or non-binary LDPC decoder 800 of FIG. 8). For example, P an/or Q type messages may be computed (in LLRV form or in metric vector form) to be passed from variable nodes to check nodes in the process of decoding the received vector in the decoder. Similarly, R type messages may be computed (by check nodes), for example, in an iterative message passing algorithm or while using a layered approach to decoding a received vector (or code) using a decoder (e.g., LDPC decoder 116 of FIG. 1, non-binary LDPC decoder 700 of FIG. 7, or non-binary LDPC decoder 800 of FIG. 8). For example, R type messages may be computed (in LLRV form or in metric vector form) to be passed from variable nodes to check nodes in the process of decoding the received vector in the decoder. P, Q, and/or R type messages may be computed, for example, as described with reference to FIGS. 2B, and 4-8, above. Next, 1006 may be executed.

At 1006, P, Q, and/or R type messages and/or any other type of soft information (e.g., an initial message) may be converted between metric vector form and LLRV form before, during, and/or after processing the P, Q, and/or R type messages. A format converter (e.g., format converter 860 of FIG. 8) may be used to perform these conversions before, during, or after decoder (e.g., LDPC decoder 116 of FIG. 1, non-binary LDPC decoder 700 of FIG. 7, or non-binary LDPC decoder 800 of FIG. 8) processing of the messages and/or soft information. Such conversions may be used by the decoder to decode a received vector (or code). Conversion between metric vector form and LLRV form may be performed as described above with respect to FIGS. 2B and 2C.

For example, when a comparison operation is to be performed on messages (e.g., when comparing P and/or Q type messages to determine entry-wise minimum values and/or minimal message values, to compute R type messages), it may be most efficient to use messages in the metric vector form. Therefore, messages may be converted from LLRV form to metric vector form prior to performance of a comparison operation in the decoder (e.g., prior to the operation of component-wise minimum computation block 716 of FIG. 7 or CNU 812 of FIG. 8). When an arithmetic operation is to be performed on messages (e.g., when computing P and/or Q type messages or performing a summation operation using messages), it may be most efficient to use the LLRV form. Therefore, messages may be converted from metric vector form to LLRV form prior to performance of an arithmetic operation in the decoder (e.g., prior to or during the operation of APP adjustment blocks 706 and/or 724 of FIG. 7, QCU 808 of FIG. 8, or PCU 816 of FIG. 8).

It should be understood that the above steps of process 1000 may be executed or performed in any order or sequence not limited to the order and sequence shown and described in the figure. Also, some of the above steps of process 1000 may be executed or performed substantially simultaneously where appropriate or in parallel to reduce latency and processing times. Some or all of the above steps of process 1000 may be executed by any of the blocks and/or components (circuitry) discussed herein.

The foregoing description of embodiments of the present disclosure provides illustration and description, but is not intended to be exhaustive or to limit the disclosure to the precise form disclosed. Modifications and variations are possible in light of the above teachings or may be acquired from practice of what is disclosed herein. For example, while a LDPC decoder is described with relation to FIGS. 1-10, these may be replaced by any type of decoder (e.g., the LDPC decoder could instead or more particularly be any type of Turbo Code decoder, any type of layered decoder, any type of flooding decoder, or any other type of decoder). The decoder may also be any variant of these decoders (e.g., a hard decoder, a bit-flipping decoder, a soft decoder, or any other variant of a decoder). Additionally, the decoder may make use of either hard information or soft information to decode incoming information. While multiple examples that make use of Galois Fields of size 4 are disclosed herein, Galois Fields of any size may be used. In addition, while certain components of this disclosure have been described as implemented in hardware and others in software, other configurations may be possible.

What is claimed is:

1. A method for decoding, using a non-binary decoder, a vector received from a communications channel, the method comprising:
   determining soft information based on the received vector using a detector;
   computing a plurality of messages based on the determined soft information, wherein each of the plurality of messages are in one of a first form and a second form; and
   converting at least one of the plurality of messages from the one of the first form and the second form to the other of the first form and the second form using format converter circuitry to thereby decode the received vector, wherein one of the first form and the second form includes a most likely non-binary variable value and values relative to a most likely variable likelihood value, wherein both the first form and the second form include non-binary variable likelihood values.

2. The method of claim 1, wherein the first form is a metric vector form and the second form is a log-likelihood-ratio vector (LLRV) form.

3. The method of claim 1, wherein the one of the first form and second form relates non-binary variable values to variable likelihood values that are relative to a most likely of the non-binary variable values.

4. The method of claim 1, wherein the converting is based on a comparison operation being performed on at least two of the plurality of messages.

5. The method of claim 1, wherein the converting is based on an arithmetic operation being performed on at least one of the plurality of messages.

6. The method of claim 1, wherein the soft information relates non-binary variable values to variable likelihood values.

7. The method of claim 1, wherein the soft information is in one of the first form and the second form.

8. The method of claim 1 wherein the computing comprises processing the soft information and the plurality of messages using a layered decoding approach.

9. The method of claim 1, wherein the received vector comprises non-binary variables chosen from elements of a Galois field.

10. The method of claim 1 wherein the non-binary decoder is a non-binary low-density parity check code (LDPC) decoder.

11. A device for decoding a vector received from a communications channel, the device comprising:
    a detector configured to determine soft information based on the received vector;
    a non-binary decoder configured to compute a plurality of messages based on the determined soft information, wherein each of the plurality of messages are in one of a first form and a second form; and
    a format converter configured to convert at least one of the plurality of messages from the one of the first form and the second form to the other of the first form and the second form to thereby decode the received vector, wherein one of the first form and the second form includes a most likely non-binary variable value and values relative to a most likely variable likelihood value, wherein both the first form and the second form include non-binary variable likelihood values.

12. The device of claim 11, wherein the first form is a metric vector form and the second form is a log-likelihood-ratio vector (LLRV) form.

13. The device of claim 11 wherein the one of the first form and second form relates non-binary variable values to variable likelihood values that are relative to a most likely of the non-binary variable values.

14. The device of claim 11, wherein the format converter is further configured to convert based on a comparison operation being performed on at least two of the plurality of messages.

15. The device of claim 11, wherein the format converter is further configured to convert based on an arithmetic operation being performed on at least one of the plurality of messages.

16. The device of claim 11, wherein the soft information relates non-binary variable values to variable likelihood values.

17. The device of claim 11, wherein the soft information is in one of the first form and the second form.

18. The device of claim 11, wherein the non-binary decoder is further configured to process the soft information and the plurality of messages using a layered decoding approach.

19. The device of claim 11, wherein the received vector comprises non-binary variables chosen from elements of a Galois field.

20. The device of claim 11, wherein the non-binary decoder is a non-binary low-density parity check code (LDPC) decoder.

* * * * *